US012665550B2

(12) United States Patent
Kogure

(10) Patent No.: US 12,665,550 B2
(45) Date of Patent: Jun. 23, 2026

(54) TRACKER MODULE, POWER AMPLIFIER MODULE, RADIO FREQUENCY MODULE, AND COMMUNICATION DEVICE

(71) Applicant: Murata Manufacturing Co., Ltd., Nagaokakyo (JP)

(72) Inventor: Takeshi Kogure, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 536 days.

(21) Appl. No.: 18/351,025

(22) Filed: Jul. 12, 2023

(65) Prior Publication Data

US 2023/0353097 A1      Nov. 2, 2023

Related U.S. Application Data

(63) Continuation of application No. PCT/JP2022/003217, filed on Jan. 28, 2022.

(30) Foreign Application Priority Data

Jan. 28, 2021     (JP) ................................. 2021-012509

(51) Int. Cl.
*H03F 3/195*          (2006.01)
*H03F 1/02*           (2006.01)
*H03F 3/24*           (2006.01)
(52) U.S. Cl.
CPC ........... *H03F 1/0233* (2013.01); *H03F 3/245* (2013.01); *H03F 2200/105* (2013.01); *H03F 2200/171* (2013.01); *H03F 2200/451* (2013.01)
(58) Field of Classification Search
CPC ....................................................... H03F 3/195

USPC .......................................................... 330/307
See application file for complete search history.

(56) References Cited

U.S. PATENT DOCUMENTS

| | | | |
|---|---|---|---|
| 2012/0294201 A1 | 11/2012 | Kurokawa et al. | |
| 2018/0316311 A1 | 11/2018 | Gebeyehu et al. | |
| 2020/0021255 A1 | 1/2020 | Goto | |
| 2020/0076375 A1 | 3/2020 | Khlat | |

FOREIGN PATENT DOCUMENTS

| | | |
|---|---|---|
| JP | 2011176529 A | 9/2011 |
| JP | 2020010005 A | 1/2020 |
| JP | 2020516194 A | 5/2020 |

OTHER PUBLICATIONS

International Search Report in PCT/JP2022/003217, mailed Mar. 29, 2022, 3 pages.

*Primary Examiner* — Henry Choe
(74) *Attorney, Agent, or Firm* — ArentFox Schiff LLP

(57)          ABSTRACT

A tracker module is provided that includes a substrate, a tracker component, a filter, a first output terminal, and a second output terminal. The first output terminal is disposed on a second main surface of the substrate and is connected to a first power amplifier. The second output terminal is disposed on the second main surface of the substrate and is connected to a second power amplifier. The first output terminal is connected to the tracker component via the filter. The second output terminal is connected to the tracker component. The first output terminal overlaps a rectangular region in a plan view in a thickness direction of the substrate that encompasses an inductor and a capacitor of the filter.

20 Claims, 12 Drawing Sheets

TRACKER MODULE, POWER AMPLIFIER MODULE, RADIO FREQUENCY MODULE, AND COMMUNICATION DEVICE

CROSS REFERENCE TO RELATED APPLICATIONS

This application is a continuation of International Application No. PCT/JP2022/003217, filed Jan. 28, 2022, which claims priority to Japanese Patent Application No. 2021-012509, filed Jan. 28, 2021, the entire contents of each of which are hereby incorporated by reference in their entirety.

TECHNICAL FIELD

The present invention generally relates to tracker modules, power amplifier (PA) modules, radio frequency (RF) modules, and communication devices. More specifically, the present invention relates to a tracker module including a tracker component, and a PA module, an RF module, and a communication device that include the tracker module.

BACKGROUND

In recent years, envelope tracking circuits (e.g., tracker modules) employing an envelope tracking method (hereinafter referred to as an "ET method") have been described, for example, in United States Patent Application Publication No. 2020/0076375 (hereinafter "Patent Document 1"). The ET method is a method of changing the amplitude of a first power supply voltage for an amplifier element of a power amplifier (PA) in accordance with the amplitude of the envelope of a radio frequency (RF) signal. More specifically, the ET method is a method of changing the collector voltage of a transistor serving as an amplifier element of a PA in accordance with an output voltage, thereby reducing power loss generated during operation when the power supply voltage is fixed, and achieving higher efficiency.

The envelope tracking circuit described in Patent Document 1 changes a power supply voltage for an amplifier circuit (e.g., a power amplifier) in accordance with the amplitude of the envelope of a transmit signal input to the amplifier circuit, and supplies the power supply voltage to the amplifier circuit.

In the tracker module described in Patent Document 1, the power supply voltage output from the tracker module to the PA is not sinusoidal, and thus the power supply voltage includes not only a fundamental wave component, but also a harmonic component. The harmonic component may be a noise component in other communications. For example, mixing of the harmonic component of the power supply voltage and a transmit signal may produce a noise component of the frequencies of the communication band of a receive signal, and may decrease the sensitivity of the receive signal.

To reduce the noise component (e.g., a harmonic component) included in the power supply voltage to be output to the PA, a filter may be provided. Such a filter may enable the noise component of the power supply voltage to be reduced, but may cause an increase in the wiring length between an output terminal connected to the PA and the filter.

SUMMARY OF THE INVENTION

Accordingly, it is an object of the present invention to provide a tracker module, a power amplifier module, a radio frequency module, and a communication device that are configured to reduce a noise component of a power supply voltage to be output to a PA and to also reduce the wiring length between an output terminal connected to the PA and a filter.

In an exemplary aspect, a tracker module is provided that is configured to output power supply voltages to a first power amplifier and a second power amplifier. The tracker module includes a substrate, a tracker component, a filter, a first output terminal, and a second output terminal. Moreover, the substrate has a first main surface and a second main surface opposed to each other. The tracker component is disposed on the first main surface of the substrate and is configured to generate the power supply voltages. The filter is disposed on the first main surface of the substrate and is connected to the tracker component. The first output terminal is disposed on the second main surface of the substrate and is connected to the first power amplifier. The second output terminal is disposed on the second main surface of the substrate and is connected to the second power amplifier. The first output terminal is connected to the tracker component via the filter and the second output terminal is connected to the tracker component. In the exemplary aspect, the filter is an inductor-capacitor (LC) filter including an inductor and a capacitor. The first output terminal overlaps a rectangular region in a plan view in a thickness direction of the substrate and encompasses the inductor and the capacitor of the filter.

According to another exemplary aspect, a power amplifier module is provided that includes the tracker module, the first power amplifier, and the second power amplifier.

In yet another exemplary aspect, a radio frequency module is provided that includes the tracker module, the first power amplifier, the second power amplifier, a first transmit filter, and a second transmit filter. The first transmit filter is configured to pass a first transmit signal amplified by the first power amplifier. The second transmit filter is configured to pass a second transmit signal amplified by the second power amplifier.

In yet another exemplary aspect, a communication device is provided that includes the tracker module, the first power amplifier, the second power amplifier, and a signal processing circuit. The signal processing circuit is configured to output a first transmit signal to the first power amplifier and output a second transmit signal to the second power amplifier.

In the tracker module, the power amplifier module, the radio frequency module, and the communication device according to the above exemplary aspects, a noise component can be reduced of a power supply voltage to be output to the first power amplifier and the wiring length between the first output terminal connected the first power amplifier and the filter can also be reduced.

DETAILED DESCRIPTION OF EMBODIMENTS

Hereinafter, tracker modules according to first to fourth exemplary embodiments will be described with reference to the drawings. The individual figures referred to in the following embodiments and the like are schematic diagrams. It is noted that the sizes and thicknesses of the individual constituent elements in the figures, and the ratios thereof do not necessarily reflect the actual dimensional ratios.

First Exemplary Embodiment

Tracker Module

The configuration of a tracker module 1 according to a first exemplary embodiment will be described with reference to the drawings.

Figure 1:
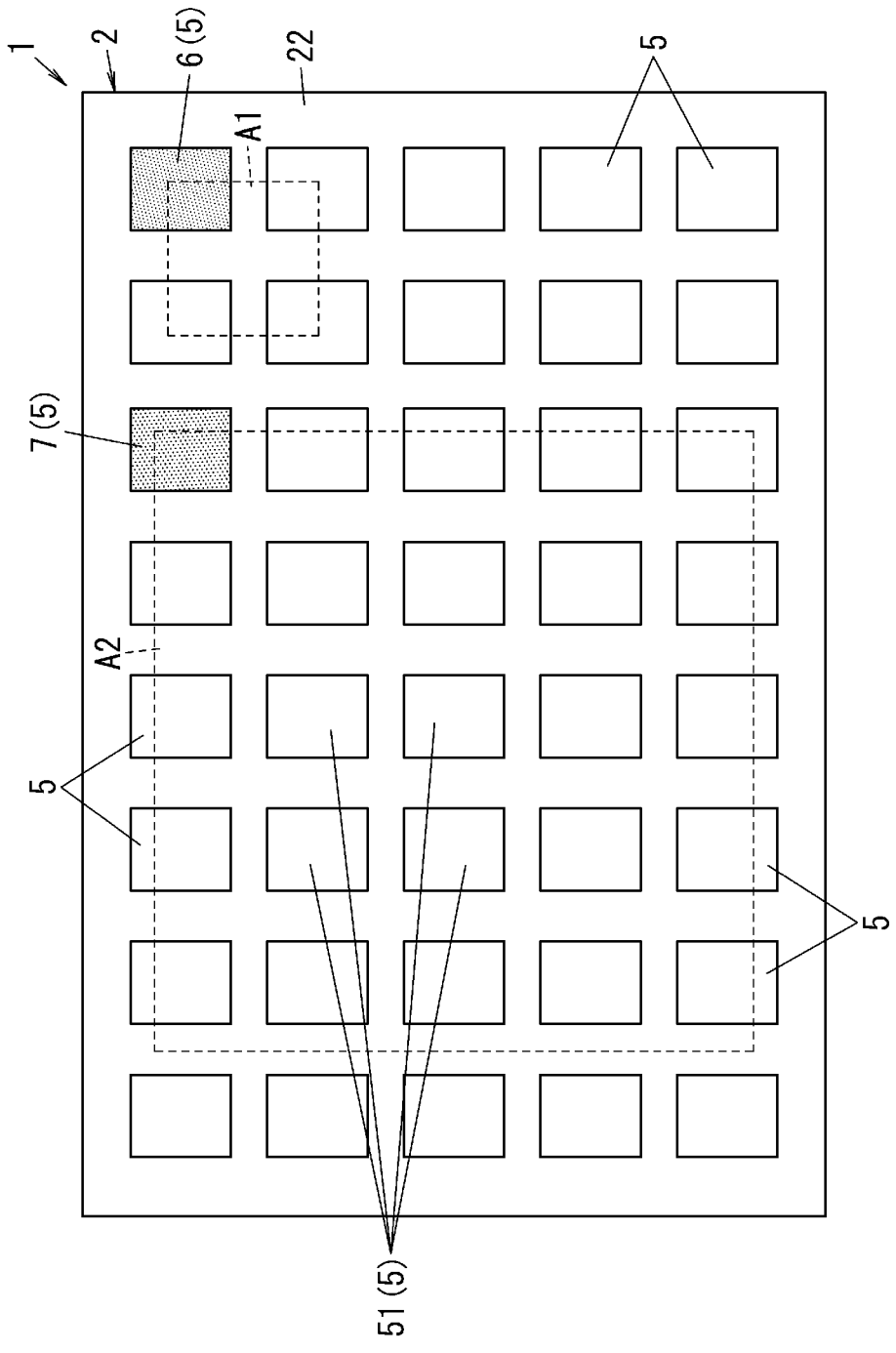
FIG. 1 is a perspective view of a tracker module according to a first exemplary embodiment.
Figure 3:
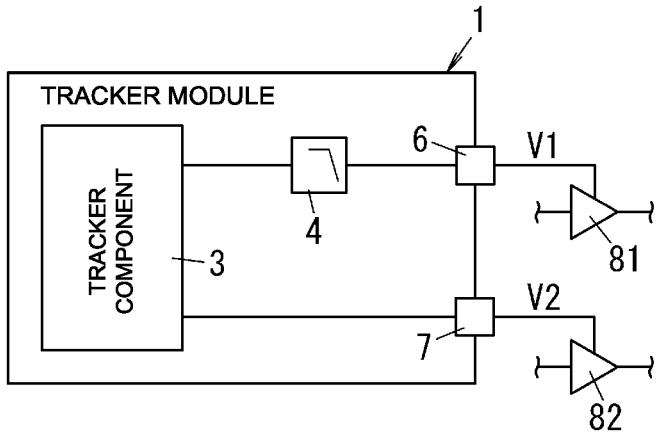
FIG. 3 is a block diagram illustrating the configuration of the tracker module according to the first exemplary embodiment.

The tracker module 1 according to the first exemplary embodiment is configured to output power supply voltages V1 and V2 to a plurality of power amplifiers (e.g., a first power amplifier (PA) 81 and a second power amplifier (PA) 82), as illustrated in FIG. 3. As shown in FIG. 1, the tracker module 1 includes a single tracker component 3 that supports a plurality of communication bands. Moreover, the first PA 81 and the second PA 82, which will be described below, are each configured to amplify a transmit signal (e.g., a radio frequency (RF) signal) in response to a corresponding one of the power supply voltages V1 and V2 being applied to the amplifier element thereof. The first PA 81 and the second PA 82 amplify transmit signals of communication bands different from each other in the exemplary aspect.

Figure 4:
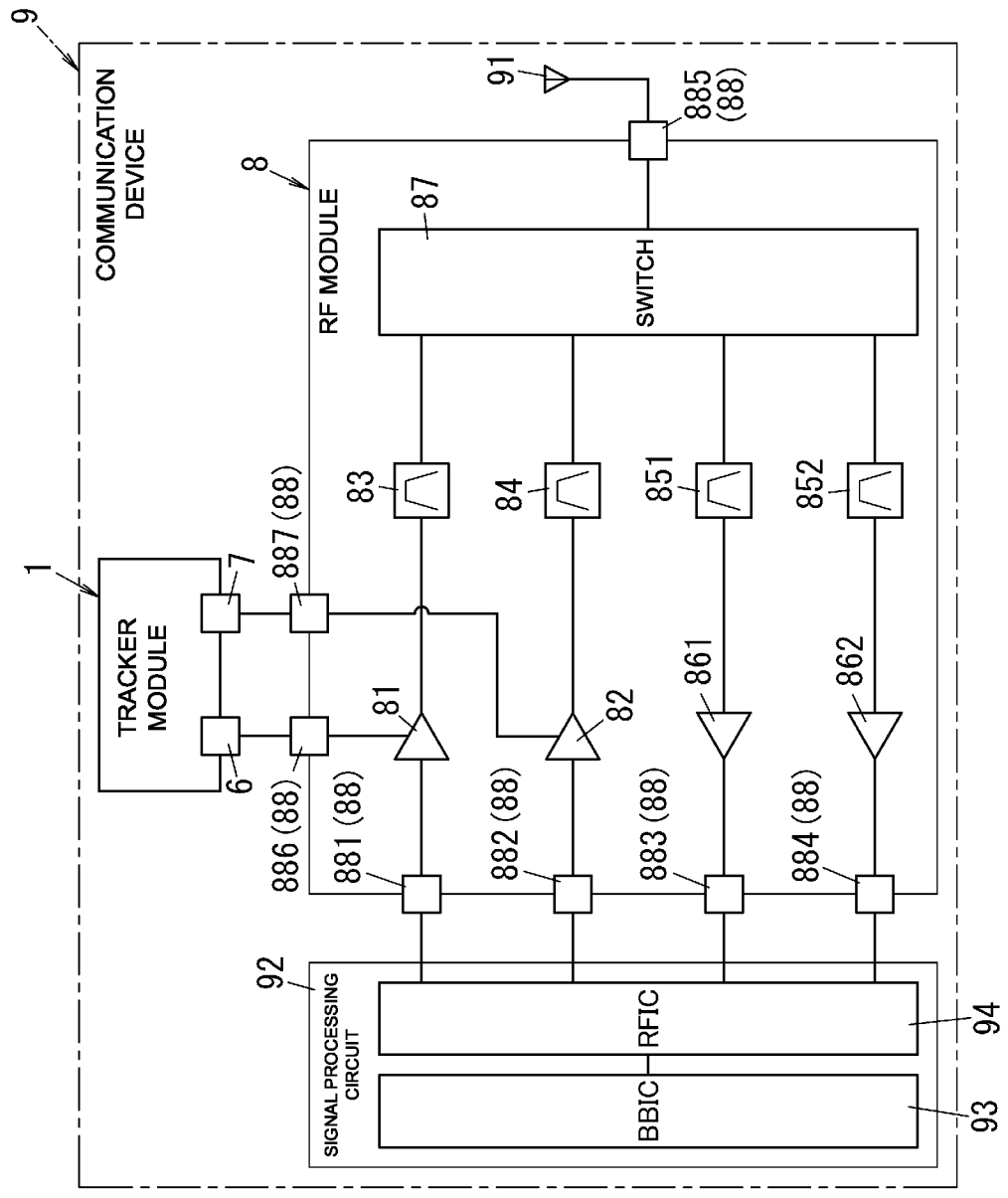
FIG. 4 is a conceptual diagram illustrating the configuration of a communication device according to the first exemplary embodiment.

The tracker module 1 is used for a communication device 9, for example, as illustrated in FIG. 4. More specifically, the tracker module 1 is used for the communication device 9 together with the first PA 81 and the second PA 82 included in a radio frequency (RF) module 8.

The communication device 9 is, for example, a mobile phone, such as a smartphone or the like. The communication device 9 is not limited to a mobile phone and may be, for example, a wearable terminal, such as a smart watch. The RF module 8 is, for example, a module conforming to the 4G (fourth generation mobile communication) standard, the 5G (fifth generation mobile communication) standard, or the like. The 4G standard is, for example, the 3GPP (Third Generation Partnership Project) LTE (Long Term Evolution) standard. The 5G standard is, for example, 5G NR (New Radio). The RF module 8 is, for example, a module that supports carrier aggregation and dual connectivity.

The communication device 9 is configured to perform communication in a plurality of communication bands. More specifically, the communication device 9 transmits transmit signals of a plurality of communication bands and receives receive signals of a plurality of communication bands.

The transmit signals and receive signals of a plurality of communication bands include frequency division duplex (FDD) signals. However, it is noted that the transmit signals and receive signals of a plurality of communication bands are not limited to FDD signals, and may be time division duplex (TDD) signals. FDD is a wireless communication technique in which transmission and reception are performed with different frequency bands being allocated to the uplink and downlink in wireless communication. TDD is a wireless communication technique in which the same frequency band is allocated to the uplink and downlink in wireless communication, and transmission and reception are performed in different time slots.

Figure 2:
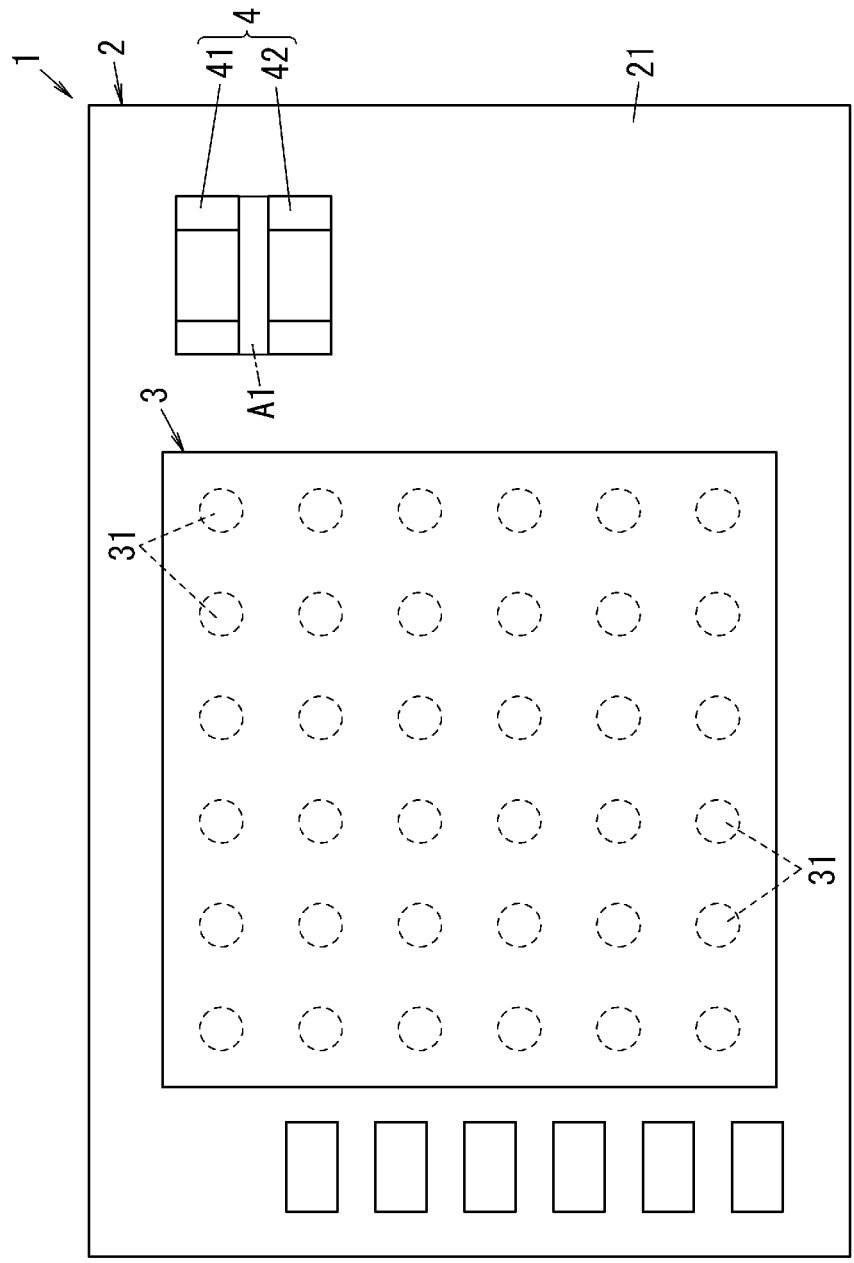
FIG. 2 is a plan view of the tracker module according to the first exemplary embodiment.

As illustrated in FIG. 1 and FIG. 2, the tracker module 1 includes a substrate 2, the tracker component 3, and a filter 4. The tracker module 1 further includes a plurality of external connection terminals 5. In an exemplary aspect, the tracker module 1 is connected to, for example, a battery (not illustrated) of a terminal or the like equipped with the RF module 8, and is supplied with a battery voltage from the battery.

When the first PA 81 and the second PA 82 amplify transmit signals by using the power supply voltages V1 and V2 from the tracker module 1, an envelope tracking method (hereinafter referred to as an "ET method") is used.

The ET method is a method of changing the amplitude level of a power supply voltage for an amplifier element of a PA in accordance with the amplitude of the envelope of an RF signal. More specifically, the ET method is a method of detecting the envelope of the amplitude of a transmit signal (e.g., an RF signal) input to an amplifier element of a PA, and changing the amplitude level of a power supply voltage for the amplifier element in accordance with the envelope. With use of the ET method, power loss can be reduced and higher efficiency can be achieved as compared with a case where the amplitude level of the power supply voltage is constant.

The ET method includes an analog envelope tracking method (hereinafter referred to as an "analog ET method") and a digital envelope tracking method (hereinafter referred to as a "digital ET method").

The analog ET method is a method of continuously detecting the envelope of the amplitude of a transmit signal (e.g., an RF signal) input to an amplifier element of a PA, and changing the amplitude level of a power supply voltage for the amplifier element in accordance with the continuously detected envelope. In the analog ET method, the envelope is continuously detected, and thus the amplitude level of the power supply voltage continuously changes.

When the analog ET method is used in the first embodiment, the tracker module 1 is configured to continuously detect the envelope of the amplitude of a first transmit signal input to the first PA 81, and to output to the first PA 81 the power supply voltage V1 whose amplitude level continuously changes in accordance with the continuously detected envelope. In addition, the tracker module 1 is configured to continuously detect the envelope of the amplitude of a second transmit signal input to the second PA 82, and to output to the second PA 82 the power supply voltage V2 whose amplitude level continuously changes in accordance with the continuously detected envelope.

The digital ET method is a method of discretely detecting the envelope of the amplitude of a transmit signal (e.g., an RF signal) input to an amplifier element of a PA, and changing the amplitude level of a power supply voltage for the amplifier element in accordance with the discretely detected envelope. In the digital ET method, the amplitude level of a transmit signal is detected not continuously but at regular intervals, and the detected amplitude level is quantized. In the digital ET method, the envelope is discretely detected, and thus the amplitude level of the power supply voltage discretely changes.

When the digital ET method is used in the first embodiment, the tracker module 1 discretely detects the envelope of the amplitude of a first transmit signal input to the first PA 81, and outputs to the first PA 81 the power supply voltage V1 whose amplitude level discretely changes in accordance with the discretely detected envelope. In addition, the tracker module 1 discretely detects the envelope of the amplitude of a second transmit signal input to the second PA 82, and outputs to the second PA 82 the power supply voltage V2 whose amplitude level discretely changes in accordance with the discretely detected envelope.

In the tracker module 1, the plurality of external connection terminals 5 include a first output terminal 6 and a second output terminal 7, as illustrated in FIG. 1 to FIG. 3. The first output terminal 6 is disposed on a second main surface 22 of the substrate 2, and is connected to the first PA 81. The second output terminal 7 is disposed on the second main surface 22 of the substrate 2, and is connected to the second PA 82. The first output terminal 6 is connected to the tracker component 3 via the filter 4. The second output terminal 7 is connected directly to the tracker component 3. In an exemplary aspect, the filter 4 is an inductor-capacitor (LC) filter including an inductor 41 and a capacitor 42.

As illustrated in FIG. 1, the first output terminal 6 overlaps a rectangular region A1 in plan view in the thickness direction of the substrate 2. The rectangular region A1 is a region that encompasses the inductor 41 and the capacitor 42 of the filter 4 illustrated in FIG. 2.

This configuration enables, in the rectangular region A1, the first output terminal 6 connected to the first PA 81 to be connected to the filter 4. As a result, the wiring length between the first output terminal 6 connected to the first PA 81 and the filter 4 is reduced.

(2) Constituent Elements of Tracker Module

Hereinafter, the individual constituent elements of the tracker module 1 according to the first embodiment will be described with reference to the drawings.
(2.1) Substrate In the exemplary aspect, the substrate 2 illustrated in FIG. 1 and FIG. 2 is a substrate different from a substrate on or in which the first PA 81 and the second PA 82 are disposed. The substrate 2 has a first main surface 21 and the second main surface 22 that are opposed to each other in the thickness direction of the substrate 2.

The substrate 2 is, for example, a low temperature co-fired ceramics (LTCC) substrate or a high temperature co-fired ceramics (HTCC) substrate having a multilayer structure of a plurality of dielectric layers, a component built-in substrate, a substrate including a redistribution layer (RDL), a printed circuit board, or the like.
(2.2) Tracker Component As illustrated in FIG. 2 and FIG. 3, the tracker component 3 is disposed on the first main surface 21 of the substrate 2, and generates the power supply voltages V1 and V2. The tracker component 3 is configured to output the power supply voltage V1 to the first PA 81. More specifically, the tracker component 3 generates the power supply voltage V1 having an amplitude level corresponding to the envelope of the amplitude of a first transmit signal, and outputs the generated power supply voltage V1 to the first PA 81. The tracker component 3 is configured to output the power supply voltage V2 to the second PA 82. More specifically, the tracker component 3 generates the power supply voltage V2 having an amplitude level corresponding to the envelope of the amplitude of a second transmit signal, and outputs the generated power supply voltage V2 to the second PA 82.

As shown in FIG. 2, for example, the tracker component 3 includes a plurality of terminals 31 that include an input terminal that receives power supply control signals. The input terminal is connected to a signal processing circuit 92 (see FIG. 4) and receives power supply control signals from the signal processing circuit 92. The tracker component 3 generates the power supply voltages V1 and V2 in response to the power supply control signals received by the input terminal. At this time, the tracker component 3 changes the amplitudes of the power supply voltages V1 and V2 in response to the power supply control signals from the signal processing circuit 92. In other words, the tracker component 3 performs envelope tracking to generate the power supply voltages V1 and V2 that vary in accordance with the envelopes of the amplitudes of RF signals output from the signal processing circuit 92.

The tracker component 3 outputs the power supply voltage V1 to the first PA 81 via the first output terminal 6 by using the ET method. Moreover, the tracker component 3 outputs the power supply voltage V2 to the second PA 82 via the second output terminal 7 by using the ET method.

In an exemplary aspect, the tracker component 3 is an integrated circuit (IC), such as a semiconductor IC, is formed by using, for example, complementary metal oxide semiconductor (CMOS), and is specifically manufactured by a silicon on insulator (SOI) process. The tracker component 3 may be made of at least one of GaAs, SiGe, and GaN. However, it is noted that the semiconductor material of the tracker component 3 is not limited to the above materials.
(2.3) Filter As illustrated in FIG. 2, the filter 4 is disposed on the first main surface 21 of the substrate 2, and is connected to the tracker component 3. As illustrated in FIG. 3, the filter 4 is connected to the tracker component 3 and the first output terminal 6. The filter 4 reduces a harmonic component of the power supply voltage V1. Accordingly, noise resulting from the power supply voltage V1 can be reduced.

As illustrated in FIG. 2, the filter 4 can be a so-called LC filter including the inductor 41 and the capacitor 42 as main constituent elements. The filter 4 is, for example, a low pass filter. In the example in FIG. 2, the filter 4 includes the inductor 41 and the capacitor 42. The inductor 41 is a chip inductor, and the capacitor 42 is a chip capacitor.

In an exemplary aspect, the filter 4 is, for example, an L-shaped filter. In a first example, the inductor 41 is disposed on a path between the tracker component 3 and the first output terminal 6, one end of the capacitor 42 is connected to a path between the inductor 41 and the first output terminal 6, and thereby the filter 4 is formed. In a second example, the inductor 41 is disposed on a path between the tracker component 3 and the first output terminal 6, one end of the capacitor 42 is connected to a path between the inductor 41 and the tracker component 3, and thereby the filter 4 is formed.

The filter 4 is disposed adjacent to the tracker component 3 on the first main surface 21 of the substrate 2. More specifically, the inductor 41 and the capacitor 42 included in the filter 4 are disposed adjacent to the tracker component 3 as shown in FIG. 2, for example. This configuration shortens the path between the tracker component 3 and the filter 4, and thus reduces a parasitic resistance component generated in the path between the tracker component 3 and the filter 4.

For purposes of this disclosure, the phrase "the filter 4 is disposed adjacent to the tracker component 3 on the first main surface 21 of the substrate 2" means that the tracker component 3 and the filter 4 are disposed on the first main surface 21 of the substrate 2 such that no other elements are interposed between the tracker component 3 and the filter 4.

(2.4) External Connection Terminals

As illustrated in FIG. 1, the plurality of external connection terminals 5 include a plurality of (e.g., four in the illustrated example) input terminals 51, the first output terminal 6, and the second output terminal 7. The plurality of external connection terminals 5 are arranged, for example, in a lattice pattern on the second main surface 22 of the substrate 2. In the example in FIG. 1, the plurality of external connection terminals 5 are arranged in a 5×8 lattice pattern.

The plurality of input terminals 51 are connected to the signal processing circuit 92 (see FIG. 4) and receive signals such as power supply control signals from the signal processing circuit 92. The signals input to the individual input terminals 51 are output to the tracker component 3.

(2.5) First Output Terminal

The first output terminal 6 illustrated in FIG. 1 is a terminal for outputting the power supply voltage V1 from the tracker module 1 to the first PA 81. More specifically, the first output terminal 6 is a terminal for outputting, to the first PA 81, the power supply voltage V1 output from the tracker component 3 and passed through the filter 4. The power supply voltage V1 passed through the filter 4 passes through the first output terminal 6.

The first output terminal 6 is disposed on the second main surface 22 of the substrate 2, as illustrated in FIG. 1. The first output terminal 6 is connected to the first PA 81, as illustrated in FIG. 3. The first output terminal 6 is connected to the filter 4. The first output terminal 6 is connected to the tracker component 3 via the filter 4.

(2.6) Second Output Terminal

The second output terminal 7 illustrated in FIG. 1 is a terminal for outputting the power supply voltage V2 from the tracker module 1 to the second PA 82. More specifically, the second output terminal 7 is a terminal for outputting, to the second PA 82, the power supply voltage V2 output from the tracker component 3. The power supply voltage V2 output from the tracker component 3 passes through the second output terminal 7.

As illustrated, the second output terminal 7 is disposed on the second main surface 22 of the substrate 2, as illustrated in FIG. 1. The second output terminal 7 is connected to the second PA 82, as illustrated in FIG. 3, and is also is connected to the tracker component 3. For purposes of this disclosure, the phrase "the second output terminal 7 is connected to the tracker component 3" means that the second output terminal 7 is connected to the tracker component 3 without via any other elements. That is, "the second output terminal 7 is connected to the tracker component 3" means that the second output terminal 7 is connected directly to the tracker component 3. Accordingly, the power supply voltage V2 to be output from the second output terminal 7 does not pass through the filter 4, avoids losses due to the filter 4, and is thus relatively high.

(2.7) Positions of First Output Terminal and Second Output Terminal

In the tracker module 1, as described above, the tracker component 3 and the filter 4 are disposed on the first main surface 21 of the substrate 2, as illustrated in FIG. 2. The filter 4 is disposed adjacent to the tracker component 3 on the first main surface 21 of the substrate 2. More specifically, at least one of the inductor 41 and the capacitor 42 included in the filter 4 is disposed adjacent to the tracker component 3.

The first output terminal 6 and the second output terminal 7 are disposed on the second main surface 22 of the substrate 2, as illustrated in FIG. 1. The first output terminal 6 is connected indirectly to the tracker component 3 via the filter 4. On the other hand, the second output terminal 7 is connected directly to the tracker component 3.

The first output terminal 6 overlaps the rectangular region A1 of the filter 4 in plan view in the thickness direction of the substrate 2. The rectangular region A1 is a region encompassing the inductor 41 and the capacitor 42 included in the filter 4.

According to the exemplary aspect, the rectangular region A1 is a region surrounded by four sides. The left side of the rectangular region A1 is a line including a leftmost edge of the inductor 41 and the capacitor 42 of the filter 4 in plan view in the thickness direction of the substrate 2. The lower side of the rectangular region A1 is a line including a lowermost edge of the inductor 41 and the capacitor 42 of the filter 4 in plan view in the thickness direction of the substrate 2. The right side of the rectangular region A1 is a line including a rightmost edge of the inductor 41 and the capacitor 42 of the filter 4 in plan view in the thickness direction of the substrate 2. The upper side of the rectangular region A1 is a line including an uppermost edge of the inductor 41 and the capacitor 42 of the filter 4 in plan view in the thickness direction of the substrate 2. The above-described edges may be points or sides.

In the example in FIG. 1, the left side of the rectangular region A1 is located on the left edges of the inductor 41 and the capacitor 42. The lower side of the rectangular region A1 is located on the lower edge of the capacitor 42. The right side of the rectangular region A1 is located on the right edges of the inductor 41 and the capacitor 42. The upper side of the rectangular region A1 is located on the upper edge of the inductor 41.

This configuration enable, in the rectangular region A1, an output terminal (not illustrated) of the filter 4 to be connected to the first output terminal 6. As a result, the wiring length between the first output terminal 6 connected to the first PA 81 and the filter 4 is reduced as compared with a case where the first output terminal connected to the first PA does not overlap the rectangular region of the filter.

In particular, in the first embodiment, the first output terminal 6 overlaps at least one of the inductor 41 and the capacitor 42 included in the filter 4 in plan view in the thickness direction of the substrate 2.

This configuration reduces the distance between the output terminal of the filter 4 and the first output terminal 6. As a result, the wiring length between the first output terminal 6 and the filter 4 can be further reduced as compared with a case where the first output terminal 6 overlaps neither the inductor 41 nor the capacitor 42.

The first output terminal 6 overlaps, of the inductor 41 and the capacitor 42, an element closest to the first output terminal 6.

For purposes of this disclosure, the phrase "an element closest to the first output terminal 6" is an element connected to the first output terminal 6 such that no other elements are interposed between the element and the first output terminal 6. As described above, the filter 4 of the first embodiment is an L-shaped filter, and thus an element close to the first output terminal 6 includes both the inductor 41 and the capacitor 42.

This configuration further reduces the distance between the output terminal of the filter 4 and the first output terminal 6. As a result, the wiring length between the first output terminal 6 and the filter 4 can be further reduced as compared with a case where the first output terminal 6 does not overlap an element closest to the first output terminal 6.

In the first embodiment, the first output terminal 6 is disposed at an outermost periphery of the second main surface 22 of the substrate 2. That is, the first output terminal 6 is disposed at an end in the arrangement of the plurality of external connection terminals 5.

For purposes of this disclosure, the phrase "the first output terminal 6 is disposed at an outermost periphery of the second main surface 22 of the substrate 2" means that the first output terminal 6 is disposed such that no other external connection terminals are interposed between the first output terminal 6 and at least one side of the outer edge of the substrate 2 on the second main surface 22 of the substrate 2. In other words, "the first output terminal 6 is disposed at an outermost periphery of the second main surface 22 of the substrate 2" means that the first output terminal 6 is disposed such that no other external connection terminals are interposed between the first output terminal 6 and at least one side of the outer edge of the substrate 2 in plan view in the thickness direction of the substrate 2. In other words, "the first output terminal 6 is disposed at an outermost periphery of the second main surface 22 of the substrate 2" means that the first output terminal 6 is disposed such that no other external connection terminals are interposed between the first output terminal 6 and the outer edge of the substrate 2 in a direction orthogonal to the thickness direction of the substrate 2.

Accordingly, the first output terminal 6 is easily connected to the first PA 81. More specifically, as a result of the tracker module 1 being disposed on a mother substrate such that the first output terminal 6 is close to the first PA 81, the wiring length between the first output terminal 6 and the first PA 81 can be reduced. As a result, a wiring pattern portion for connecting the first output terminal 6 and the first PA 81 is formed more easily than in a case where the first output terminal 6 is not disposed at the outermost periphery.

The second output terminal 7 overlaps the tracker component 3 in plan view in the thickness direction of the substrate 2. That is, the second output terminal 7 overlaps a region A2 in plan view in the thickness direction of the substrate 2. The region A2 is a region in which the tracker component 3 is disposed.

This configuration enables, in the region A2, an output terminal of the tracker component 3 to be connected to the second output terminal 7. As a result, the wiring length between the second output terminal 7 connected to the second PA 82 and the tracker component 3 is reduced as compared with a case where the second output terminal connected to the second PA does not overlap the region of the tracker component.

(3) Constituent Elements of RF Module

Hereinafter, the individual constituent elements of the RF module 8 according to the first embodiment will be described with reference to the drawings.

As illustrated in FIG. 4, the RF module 8 includes the first PA 81, the second PA 82, a first transmit filter 83, a second transmit filter 84, a first receive filter 851, a second receive filter 852, a first low-noise amplifier 861, a second low-noise amplifier 862, a switch 87, a plurality of external connection terminals 88, and a controller 89. The plurality of external connection terminals 88 include signal input terminals 881 and 882, signal output terminals 883 and 884, an antenna terminal 885, and terminals 886 and 887.

In operation, the RF module 8 is configured to amplify the power of an RF signal output from an RF signal processing circuit 94, which will be described below, to a level necessary for transmitting the RF signal to a base station (not illustrated), and outputs the amplified RF signal.

(3.1) Power Amplifiers

The first PA 81 illustrated in FIG. 4 includes a transistor (e.g., an amplifier element). The transistor of the first PA 81 is, for example, an NPN transistor, and is an amplifier element that amplifies an RF signal by being supplied with the power supply voltage V1. The transistor amplifies an RF signal output from the RF signal processing circuit 94. The transistor has a collector electrically connected to the first output terminal 6 of the tracker module 1 via the terminal 886. The transistor has an emitter that is at ground potential.

The power supply voltage V1 is applied to the transistor of the first PA 81. The transistor has a base that receives an RF signal output from the RF signal processing circuit 94. The tracker module 1 is connected to the collector of the transistor. To the collector of the transistor, the power supply voltage V1 controlled in accordance with the amplitude level of the RF signal is applied from the tracker module 1. The collector of the transistor is connected to the first transmit filter 83.

The ET method is used as described above, and thus the amplitude level of the power supply voltage V1 changes in accordance with amplitude variations of the RF signal.

According to the exemplary aspect, the first PA 81 is, for example, a PA that amplifies an FDD transmit signal. More specifically, the first PA 81 is a PA that amplifies a transmit signal whose communication band is the mid band. The first PA 81 is, for example, a PA that supports Band 30. The first PA 81 is a PA for FDD. Thus, when the first PA 81 is operated by the power supply voltage V1 and a transmission operation is being performed in the RF module 8, a reception operation is also being performed. Thus, it is preferable that the harmonic component (e.g., noise component) of the power supply voltage V1 be small.

The second PA 82 illustrated in FIG. 4 includes a transistor (e.g., an amplifier element). The transistor of the second PA 82 is, for example, an NPN transistor, and is an amplifier element that amplifies an RF signal by being supplied with the power supply voltage V2. The transistor amplifies an RF signal output from the RF signal processing circuit 94. The transistor has a collector electrically connected to the second output terminal 7 of the tracker module 1 via the terminal 887. The transistor has an emitter that is at ground potential.

The power supply voltage V2 is applied to the transistor of the second PA 82. The transistor has a base that receives an RF signal output from the RF signal processing circuit 94. The tracker module 1 is connected to the collector of the transistor. To the collector of the transistor, the power supply voltage V2 controlled in accordance with the amplitude level of the RF signal is applied from the tracker module 1. The collector of the transistor is connected to the second transmit filter 84.

The ET method is used as described above, and thus the amplitude level of the power supply voltage V2 changes in accordance with amplitude variations of the RF signal.

In an exemplary aspect, the second PA 82 is, for example, a PA that is configured to amplify a TDD transmit signal. More specifically, the second PA 82 is a PA that amplifies a transmit signal whose communication band is the high band. The second PA 82 is, for example, a PA that supports n41. Thus, a relatively high voltage is necessary as the power supply voltage V2 for the second PA 82. That is, the power supply voltage V2 for the second PA 82 is higher than the power supply voltage V1 for the first PA 81.

(3.2) Transmit Filters

The first transmit filter 83 is a transmit filter of a communication band that allows an RF signal to pass therethrough, as illustrated in FIG. 4. The first transmit filter 83 is disposed on a path between the first PA 81 and the antenna terminal 885 in a transmit path. More specifically, the first transmit filter 83 is disposed on a path between the first PA 81 and the switch 87. The first transmit filter 83 passes an RF signal that has been amplified in power by the first PA 81 and output from the first PA 81. The transmit path is a path connecting the signal input terminal 881 and the antenna terminal 885 to transmit an RF signal from an antenna 91.

The second transmit filter 84 is a transmit filter of a communication band that allows an RF signal to pass therethrough, as illustrated in FIG. 4. The second transmit filter 84 is disposed on a path between the second PA 82 and the antenna terminal 885 in a transmit path. More specifically, the second transmit filter 84 is disposed on a path between the second PA 82 and the switch 87. The second transmit filter 84 passes an RF signal that has been amplified in power by the second PA 82 and output from the second PA 82. The transmit path is a path connecting the signal input terminal 882 and the antenna terminal 885 to transmit an RF signal from the antenna 91.

The filter that passes an RF signal output from the first PA 81 is not limited to a transmit filter such as the first transmit filter 83 and can be a duplexer including both a transmit filter and a receive filter, or can be a multiplexer including three or more filters.

The filter that passes an RF signal output from the second PA 82 is not limited to a transmit filter such as the second transmit filter 84 and can be a duplexer including both a transmit filter and a receive filter, or may be a multiplexer including three or more filters.

(3.3) Switch

The switch 87 is a switch for switching the path to be connected to the antenna terminal 885, as illustrated in FIG. 4. In other words, the switch 87 is a switch for switching the filter to be connected to the antenna terminal 885 among a plurality of filters including the first transmit filter 83, the second transmit filter 84, the first receive filter 851, and the second receive filter 852.

The switch 87 is, for example, a switch integrated circuit (IC). The switch 87 is, for example, controlled by the signal processing circuit 92, which will be described below. The switch 87 switches a connection state in response to a control signal from the RF signal processing circuit 94 of the signal processing circuit 92.

(3.4) Antenna Terminal

The antenna terminal 885 is a terminal connected to the antenna 91, which will be described below, as illustrated in FIG. 4. An RF signal from the RF module 8 is input to the antenna 91 via the antenna terminal 885. An RF signal from the antenna 91 is input to the RF module 8 via the antenna terminal 885.

(3.5) Controller

Figure 5:
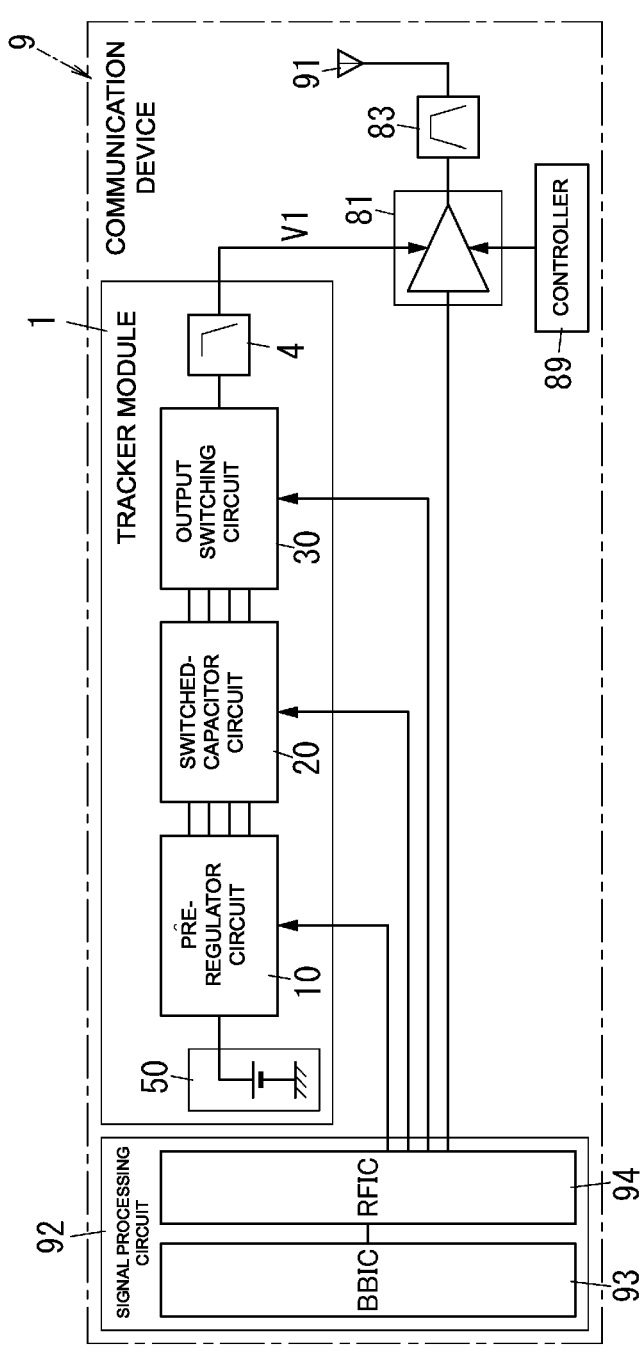
FIG. 5 is a conceptual diagram illustrating the configuration of the communication device according to the first exemplary embodiment.

The controller 89 illustrated in FIG. 5 is a PA control circuit that is configured to control the magnitudes and supply timings of bias currents (or bias voltages) to be supplied to the first PA 81 and the second PA 82 in response to receipt of a control signal from the RF signal processing circuit 94.

(4) Communication Device

Next, the communication device 9 including the tracker module 1 will be described with reference to the drawings.

As illustrated in FIG. 4, the communication device 9 includes the tracker module 1, the RF module 8, the antenna 91, and the signal processing circuit 92.

(4.1) Antenna

The antenna 91 is connected to the antenna terminal 885 of the RF module 8, as illustrated in FIG. 4. The antenna 91 has a radiation function of radiating an RF signal (transmit signal) output from the RF module 8 as a radio wave, and a reception function of receiving an RF signal (receive signal) as a radio wave from the outside and outputting the received RF signal to the RF module 8.

(4.2) Signal Processing Circuit

As illustrated in FIG. 4, the signal processing circuit 92 includes a baseband signal processing circuit 93 and the RF signal processing circuit 94. The signal processing circuit 92 outputs an RF signal to the RF module 8. Specifically, the signal processing circuit 92 outputs transmit signals to the first PA 81 and the second PA 82.

The baseband signal processing circuit 93 is, for example, a baseband integrated circuit (BBIC), and performs signal processing on an RF signal. The RF signal has a frequency of around several hundred MHz to several GHz, for example.

The baseband signal processing circuit 93 generates an I-phase signal and a Q-phase signal from a baseband signal. The baseband signal is, for example, an audio signal, an image signal, or the like received from the outside. The baseband signal processing circuit 93 combines the I-phase signal and the Q-phase signal to perform IQ modulation processing, and outputs a transmit signal. At this time, the transmit signal is generated as a modulated signal (IQ signal), which is obtained through amplitude modulation performed on a carrier signal of a predetermined frequency in a period longer than the period of the carrier signal. The modulated signal is output as an IQ signal from the baseband signal processing circuit 93. The IQ signal is a signal whose amplitude and phase are represented on an IQ plane. The IQ signal has a frequency of around several MHz to several tens of MHz, for example.

The RF signal processing circuit 94 is, for example, a radio frequency integrated circuit (RFIC), and performs signal processing on an RF signal. For example, the RF signal processing circuit 94 performs predetermined signal processing on the modulated signal (IQ signal) output from the baseband signal processing circuit 93. More specifically, the RF signal processing circuit 94 performs signal processing such as up-conversion on the modulated signal output from the baseband signal processing circuit 93, and outputs the RF signal generated through the signal processing to the RF module 8. The signal processing performed by the RF signal processing circuit 94 is not limited to direct conversion from the modulated signal into the RF signal. The RF signal processing circuit 94 can be configured to convert the modulated signal into an intermediate frequency (IF) signal and further configured to generate an RF signal from the IF signal obtained through the conversion.

The signal processing circuit 92 outputs a power supply control signal to the tracker component 3 of the tracker module 1. The power supply control signal is a signal including information regarding amplitude variations of an RF signal and is output from the signal processing circuit 92 to the tracker module 1 in order to change the amplitudes of the power supply voltages V1 and V2. The power supply control signal includes, for example, an I-phase signal and a Q-phase signal.

(5) Details of Tracker Module

Next, the tracker module 1 according to the first embodiment will be described in detail with reference to FIG. 5 and FIG. 6.

Figure 6:
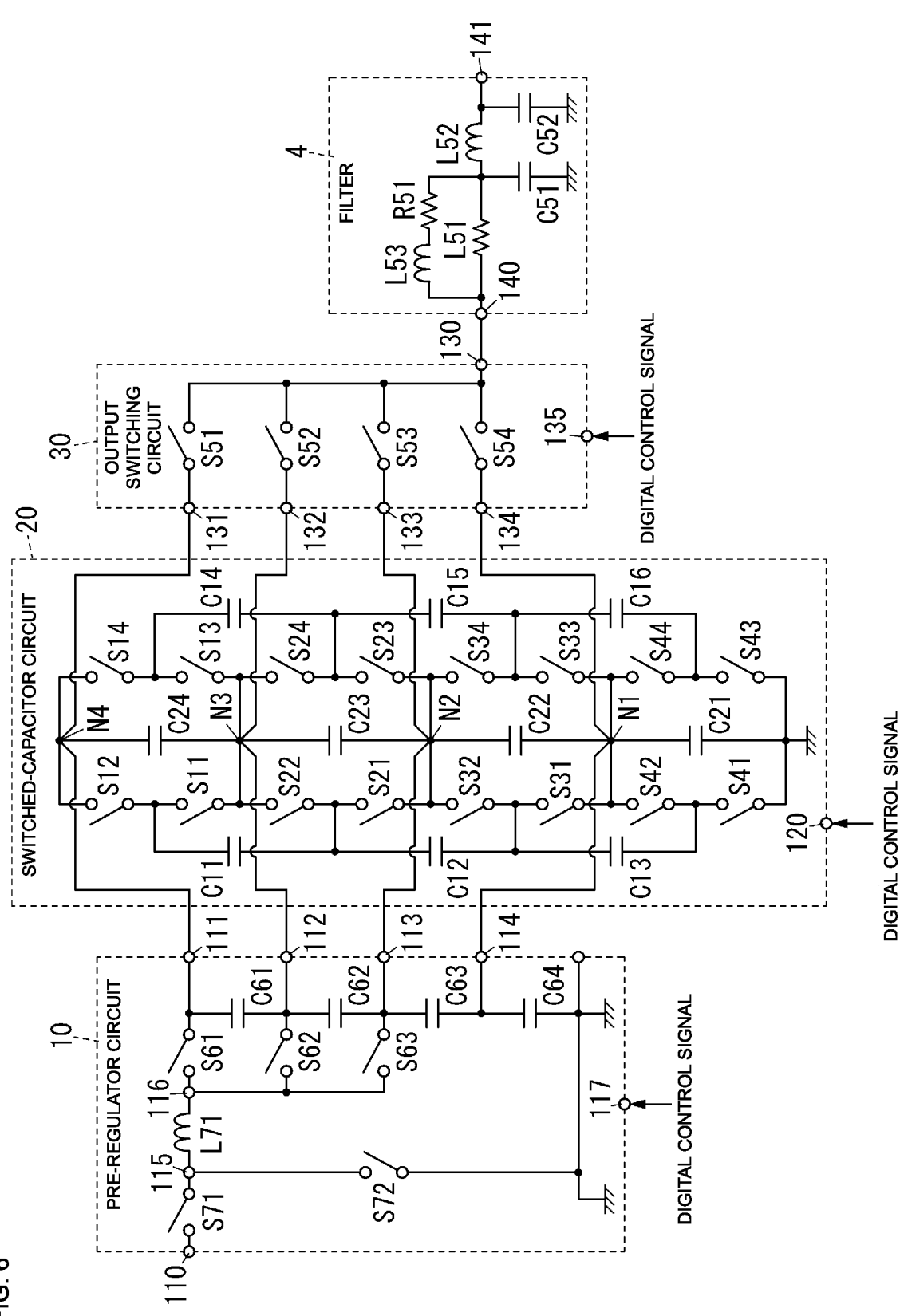
FIG. 6 is a conceptual diagram illustrating the configuration of a tracker of the tracker module according to the first exemplary embodiment.

As illustrated in FIG. 5 and FIG. 6, the tracker module 1 includes a pre-regulator circuit 10, a switched-capacitor circuit 20, an output switching circuit 30, the filter 4, and a direct-current (DC) power source 50.

The tracker module 1 supplies the first PA 81 and the second PA 82 with the power supply voltages V1 and V2, respectively, each having a power supply voltage level selected from among a plurality of discrete voltage levels in response to an envelope signal.

The pre-regulator circuit 10 includes a power inductor and a switch. The power inductor is an inductor used to raise and/or lower (raise, lower, or raise and lower) a DC voltage. The power inductor is disposed in series with a DC path. The pre-regulator circuit 10 converts a voltage by using the power inductor. For purposes of this disclosure, the pre-regulator circuit 10 can also be referred to as a magnetic regulator or a DC-DC converter. Alternatively, the power inductor can be connected between a series path and ground (i.e., disposed in parallel).

The pre-regulator circuit 10 need not necessarily include the power inductor, and may be, for example, a circuit or the like that raises and/or lowers (raises, lowers, or raises and lowers) a voltage by switching between capacitors disposed on a series-arm path and a parallel-arm path of the pre-regulator circuit 10.

The switched-capacitor circuit 20 includes a plurality of capacitors and a plurality of switches and is configured to generate a plurality of voltages respectively having a plurality of discrete voltage levels from the voltage output from the pre-regulator circuit 10. For purposes of this disclosure, the switched-capacitor circuit 20 can also be referred to as a switched-capacitor voltage balancer.

The output switching circuit 30 selects, in response to a digital control signal corresponding to an envelope signal, at least one of the plurality of voltages generated by the switched-capacitor circuit 20, and outputs the selected voltage to the filter 4.

The filter 4 filters a signal (voltage) received from the output switching circuit 30. The filter 4 includes, for example, a low pass filter (LPF).

The DC power source 50 supplies a DC voltage to the pre-regulator circuit 10. The DC power source 50 may be, but is not limited to, a rechargeable battery, for example.

The tracker module 1 need not necessarily include at least one of the pre-regulator circuit 10 and the DC power source 50. For example, the tracker module 1 need not necessarily include the DC power source 50. Any combination of the pre-regulator circuit 10, the switched-capacitor circuit 20, the output switching circuit 30, and the filter 4 may be integrated into a single circuit. A detailed circuit configuration example of the tracker module 1 will be described below with reference to FIG. 6.

(5.1) Circuit Configuration of Tracker Module

Next, the circuit configurations of the pre-regulator circuit 10, the switched-capacitor circuit 20, the output switching circuit 30, and the filter 4 included in the tracker module 1 will be described with reference to FIG. 6.

FIG. 6 illustrates an exemplary circuit configuration. The pre-regulator circuit 10, the switched-capacitor circuit 20, the output switching circuit 30, and the filter 4 may be mounted by using any one of a wide variety of circuit packaging methods and circuit techniques. Thus, the description of the individual circuits provided below should not be construed in a limiting manner.

(5.2) Switched-Capacitor Circuit

As illustrated in FIG. 6, the switched-capacitor circuit 20 includes a plurality of (six in the illustrated example) capacitors C11 to C16, a plurality of (four in the illustrated example) capacitors C21 to C24, a plurality of (sixteen in the illustrated example) switches S11 to S14, S21 to S24, S31 to S34, and S41 to S44, and a control terminal 120.

The control terminal 120 is an input terminal for a digital control signal. More specifically, the control terminal 120 is a terminal for receiving a digital control signal for controlling the switched-capacitor circuit 20. The digital control signal received via the control terminal 120 is, for example, a control signal of a source synchronous scheme in which a data signal and a clock signal are transmitted. The digital control signal is not limited to a source-synchronous control signal. For example, the digital control signal may be a clock-embedded control signal.

The plurality of capacitors C11 to C16 each function as a flying capacitor (transfer capacitor). That is, the plurality of capacitors C11 to C16 are each used to raise or lower the voltage supplied from the pre-regulator circuit 10. More specifically, the plurality of capacitors C11 to C16 cause electric charges to move between the capacitors C11 to C16 and nodes N1 to N4 so that voltages V11 to V14 (voltages with respect to ground potential) satisfying V11:V12:V13: V14=1:2:3:4 are maintained at the four nodes N1 to N4. The plurality of voltages V11 to V14 correspond to a plurality of voltages respectively having a plurality of discrete voltage levels.

The capacitor C11 has two electrodes (first electrode and second electrode). One of the two electrodes (first electrode) of the capacitor C11 is connected to one terminal (first terminal) of the switch S1*l* and one terminal (first terminal) of the switch S12. The other of the two electrodes (second electrode) of the capacitor C11 is connected to one terminal (first terminal) of the switch S21 and one terminal (first terminal) of the switch S22.

The capacitor C12 has two electrodes (first electrode and second electrode). One of the two electrodes (first electrode) of the capacitor C12 is connected to the one terminal (first terminal) of the switch S21 and the one terminal (first terminal) of the switch S22. The other of the two electrodes (second electrode) of the capacitor C12 is connected to one terminal (first terminal) of the switch S31 and one terminal (first terminal) of the switch S32.

The capacitor C13 has two electrodes (first electrode and second electrode). One of the two electrodes (first electrode) of the capacitor C13 is connected to the one terminal (first terminal) of the switch S31 and the one terminal (first terminal) of the switch S32. The other of the two electrodes (second electrode) of the capacitor C13 is connected to one terminal (first terminal) of the switch S41 and one terminal (first terminal) of the switch S42.

The capacitor C14 has two electrodes (first electrode and second electrode). One of the two electrodes (first electrode) of the capacitor C14 is connected to one terminal (first terminal) of the switch S13 and one terminal (first terminal) of the switch S14. The other of the two electrodes (second electrode) of the capacitor C14 is connected to one terminal (first terminal) of the switch S23 and one terminal (first terminal) of the switch S24.

The capacitor C15 has two electrodes (first electrode and second electrode). One of the two electrodes (first electrode) of the capacitor C15 is connected to the one terminal (first terminal) of the switch S23 and the one terminal (first terminal) of the switch S24. The other of the two electrodes (second electrode) of the capacitor C15 is connected to one terminal (first terminal) of the switch S33 and one terminal (first terminal) of the switch S34.

The capacitor C16 has two electrodes (first electrode and second electrode). One of the two electrodes (first electrode) of the capacitor C16 is connected to the one terminal (first terminal) of the switch S33 and the one terminal (first terminal) of the switch S34. The other of the two electrodes (second electrode) of the capacitor C16 is connected to one terminal (first terminal) of the switch S43 and one terminal (first terminal) of the switch S44.

A set of the capacitors C11 and C14, a set of the capacitors C12 and C15, and a set of the capacitors C13 and C16 can each be charged and discharged in a complementary manner as a result of the following first phase and second phase being repeated.

Specifically, in the first phase, the switches S12, S13, S22, S23, S32, S33, S42, and S43 are turned ON. Accordingly, for example, the one of the two electrodes (first electrode) of the capacitor C12 is connected to the node N3, the other of the two electrodes (second electrode) of the capacitor C12 and the one of the two electrodes (first electrode) of the capacitor C15 are connected to the node N2, and the other of the two electrodes (second electrode) of the capacitor C15 is connected to the node N1.

On the other hand, in the second phase, the switches S11, S14, S21, S24, S31, S34, S41, and S44 are turned ON. Accordingly, for example, the one of the two electrodes (first electrode) of the capacitor C15 is connected to the node N3, the other of the two electrodes (second electrode) of the capacitor C15 and the one of the two electrodes (first electrode) of the capacitor C12 are connected to the node N2, and the other of the two electrodes (second electrode) of the capacitor C12 is connected to the node N1.

As a result of the first phase and the second phase being repeated, for example, when one of the capacitors C12 and C15 is charged through the node N2, the other of the capacitors C12 and C15 can be discharged to the capacitor C23. In short, the capacitors C12 and C15 can be charged and discharged in a complementary manner. The capacitors C12 and C15 serve as a pair of flying capacitors that are charged and discharged in a complementary manner.

Similarly, to the set of the capacitors C12 and C15, a set of any one of the capacitors C11 to C13 and any one of the capacitors C14 to C16 also serves as a pair of flying capacitors that are charged through a node and discharged to a smoothing capacitor in a complementary manner as a result of appropriate switching.

The plurality of capacitors C21 to C24 each function as a smoothing capacitor. Specifically, the capacitors C21 to C24 are used to hold and smooth the voltages V11 to V14 at the nodes N1 to N4.

The capacitor C21 is connected between the node N1 and ground. Specifically, one of the two electrodes (first electrode) of the capacitor C21 is connected to the node N1. On the other hand, the other of the two electrodes (second electrode) of the capacitor C21 is connected to ground.

The capacitor C22 is connected between the node N2 and the node N1. Specifically, one of the two electrodes (first electrode) of the capacitor C22 is connected to the node N2. On the other hand, the other of the two electrodes (second electrode) of the capacitor C22 is connected to the node N1.

The capacitor C23 is connected between the node N3 and the node N2. Specifically, one of the two electrodes (first electrode) of the capacitor C23 is connected to the node N3. On the other hand, the other of the two electrodes (second electrode) of the capacitor C23 is connected to the node N2.

The capacitor C24 is connected between the node N4 and the node N3. Specifically, one of the two electrodes (first electrode) of the capacitor C24 is connected to the node N4. On the other hand, the other of the two electrodes (second electrode) of the capacitor C24 is connected to the node N3.

The switch S11 is connected between the one of the two electrodes (first electrode) of the capacitor C11 and the node N3. Specifically, the one terminal (first terminal) of the switch S11 is connected to the one of the two electrodes of the capacitor C11. On the other hand, the other terminal (second terminal) of the switch S11 is connected to the node N3.

The switch S12 is connected between the one of the two electrodes (first electrode) of the capacitor C11 and the node N4. Specifically, the one terminal (first terminal) of the switch S12 is connected to the one of the two electrodes of the capacitor C11. On the other hand, the other terminal (second terminal) of the switch S12 is connected to the node N4.

The switch S21 is connected between the one of the two electrodes (first electrode) of the capacitor C12 and the node N2. Specifically, the one terminal (first terminal) of the switch S21 is connected to the one of the two electrodes of the capacitor C12 and the other of the two electrodes (second electrode) of the capacitor C11. On the other hand, the other terminal (second terminal) of the switch S21 is connected to the node N2.

The switch S22 is connected between the one of the two electrodes (first electrode) of the capacitor C12 and the node N3. Specifically, the one terminal (first terminal) of the switch S22 is connected to the one of the two electrodes of the capacitor C12 and the other of the two electrodes (second electrode) of the capacitor C11. On the other hand, the other terminal (second terminal) of the switch S22 is connected to the node N3.

The switch S31 is connected between the other of the two electrodes (second electrode) of the capacitor C12 and the node N1. Specifically, the one terminal (first terminal) of the switch S31 is connected to the other of the two electrodes of the capacitor C12 and the one of the two electrodes (first electrode) of the capacitor C13. On the other hand, the other terminal (second terminal) of the switch S31 is connected to the node N1.

The switch S32 is connected between the other of the two electrodes (second electrode) of the capacitor C12 and the node N2. Specifically, the one terminal (first terminal) of the switch S32 is connected to the other of the two electrodes of the capacitor C12 and the one of the two electrodes (first electrode) of the capacitor C13. On the other hand, the other terminal (second terminal) of the switch S32 is connected to the node N2. That is, the other terminal of the switch S32 is connected to the other terminal (second terminal) of the switch S21.

The switch S41 is connected between the other of the two electrodes (second electrode) of the capacitor C13 and ground. Specifically, the one terminal (first terminal) of the switch S41 is connected to the other of the two electrodes (second electrode) of the capacitor C13. On the other hand, the other terminal (second terminal) of the switch S41 is connected to ground.

The switch S42 is connected between the other of the two electrodes (second electrode) of the capacitor C13 and the node N1. Specifically, the one terminal (first terminal) of the switch S42 is connected to the other of the two electrodes (second electrode) of the capacitor C13. On the other hand, the other terminal (second terminal) of the switch S42 is connected to the node N1. That is, the other terminal of the switch S42 is connected to the other terminal (second terminal) of the switch S31.

The switch S13 is connected between the one of the two electrodes (first electrode) of the capacitor C14 and the node N3. Specifically, the one terminal (first terminal) of the switch S13 is connected to the one of the two electrodes (first electrode) of the capacitor C14. On the other hand, the other terminal (second terminal) of the switch S13 is connected to the node N3. That is, the other terminal of the switch S13 is connected to the other terminal (second terminal) of the switch S11 and the other terminal (second terminal) of the switch S22.

The switch S14 is connected between the one of the two electrodes (first electrode) of the capacitor C14 and the node N4. Specifically, the one terminal (first terminal) of the switch S14 is connected to the one of the two electrodes (first electrode) of the capacitor C14. On the other hand, the other terminal (second terminal) of the switch S14 is connected to the node N4. That is, the other terminal of the switch S14 is connected to the other terminal (second terminal) of the switch S12.

The switch S23 is connected between the one of the two electrodes (first electrode) of the capacitor C15 and the node N2. Specifically, the one terminal (first terminal) of the switch S23 is connected to the one of the two electrodes (first electrode) of the capacitor C15 and the other of the two electrodes (second electrode) of the capacitor C14. On the other hand, the other terminal (second terminal) of the switch S23 is connected to the node N2. That is, the other terminal of the switch S23 is connected to the other terminal (second terminal) of the switch S21 and the other terminal (second terminal) of the switch S32.

The switch S24 is connected between the one of the two electrodes (first electrode) of the capacitor C15 and the node N3. Specifically, the one terminal (first terminal) of the switch S24 is connected to the one of the two electrodes (first electrode) of the capacitor C15 and the other of the two electrodes (second electrode) of the capacitor C14. On the other hand, the other terminal (second terminal) of the switch S24 is connected to the node N3. That is, the other terminal of the switch S24 is connected to the other terminal (second terminal) of the switch S11, the other terminal (second terminal) of the switch S22, and the other terminal (second terminal) of the switch S13.

The switch S33 is connected between the other of the two electrodes (second electrode) of the capacitor C15 and the node N1. Specifically, the one terminal (first terminal) of the switch S33 is connected to the other of the two electrodes (second electrode) of the capacitor C15 and the one of the two electrodes (first electrode) of the capacitor C16. On the other hand, the other terminal (second terminal) of the switch S33 is connected to the node N1. That is, the other terminal of the switch S33 is connected to the other terminal (second terminal) of the switch S31 and the other terminal (second terminal) of the switch S42.

The switch S34 is connected between the other of the two electrodes (second electrode) of the capacitor C15 and the node N2. Specifically, the one terminal (first terminal) of the switch S34 is connected to the other of the two electrodes (second electrode) of the capacitor C15 and the one of the two electrodes (first electrode) of the capacitor C16. On the other hand, the other terminal (second terminal) of the switch S34 is connected to the node N2. That is, the other terminal of the switch S34 is connected to the other terminal (second terminal) of the switch S21, the other terminal (second terminal) of the switch S32, and the other terminal (second terminal) of the switch S23.

The switch S43 is connected between the other of the two electrodes (second electrode) of the capacitor C16 and ground. Specifically, the one terminal (first terminal) of the switch S43 is connected to the other of the two electrodes (second electrode) of the capacitor C16. On the other hand, the other terminal (second terminal) of the switch S43 is connected to ground.

The switch S44 is connected between the other of the two electrodes (second electrode) of the capacitor C16 and the node N1. Specifically, the one terminal (first terminal) of the switch S44 is connected to the other of the two electrodes (second electrode) of the capacitor C16. On the other hand, the other terminal (second terminal) of the switch S44 is connected to the node N1. That is, the other terminal of the switch S44 is connected to the other terminal (second terminal) of the switch S31, the other terminal (second terminal) of the switch S42, and the other terminal (second terminal) of the switch S33.

A first set of switches including the switches S12, S13, S22, S23, S32, S33, S42, and S43, and a second set of switches including the switches S11, S14, S21, S24, S31, S34, S41, and S44 are turned ON and OFF in a complementary manner. Specifically, in the first phase, the switches in the first set are turned ON whereas the switches in the second set are turned OFF. Conversely, in the second phase, the switches in the first set are turned OFF whereas the switches in the second set are turned ON.

For example, in one of the first phase and the second phase, charging from the capacitors C11 to C13 to the capacitors C21 to C24 is performed, and in the other of the first phase and the second phase, charging from the capacitors C14 to C16 to the capacitors C21 to C24 is performed. In other words, because the capacitors C21 to C24 are constantly charged by the capacitors C11 to C13 or the capacitors C14 to C16, the nodes N1 to N4 are rapidly replenished with electric charges even if currents rapidly flow from the nodes N1 to N4 to the output switching circuit 30. Thus, potential variations at the nodes N1 to N4 can be suppressed.

As a result of operating in the above-described manner, the switched-capacitor circuit 20 is capable of maintaining substantially equal voltages across each of the capacitors C21 to C24. Specifically, the voltages V11 to V14 (voltages with respect to ground potential) satisfying V11:V12:V13:V14=1:2:3:4 are maintained at the four nodes N1 to N4. The levels of the voltages V11 to V14 correspond to a plurality of discrete voltage levels supplied to the output switching circuit 30 by the switched-capacitor circuit 20.

The voltage ratio V11:V12:V13:V14 is not limited to 1:2:3:4. For example, the voltage ratio V11:V12:V13:V14 may be 1:2:4:8 in alternative aspects.

The configuration of the switched-capacitor circuit 20 illustrated in FIG. 6 is an example. The configuration of the switched-capacitor circuit 20 is not limited to the configuration illustrated in FIG. 6. In FIG. 6, the switched-capacitor circuit 20 is configured to be capable of supplying voltages of four discrete voltage levels, but the configuration thereof is not limited to the configuration of being capable of supplying voltages of four discrete voltage levels. The switched-capacitor circuit 20 may be configured to be capable of supplying voltages of any number of two or more discrete voltage levels. For example, in a case where voltages of two discrete voltage levels are supplied, it is sufficient that the switched-capacitor circuit 20 include at least the capacitors C12 and C15 and the switches S21, S22, S31, S32, S23, S24, S33, and S34.

The switches included in the switched-capacitor circuit 20 are included in the tracker component 3 (see FIG. 3). Specifically, the tracker component 3 includes the plurality of switches S11 to S14, S21 to S24, S31 to S34, and S41 to S44.

(5.3) Output Switching Circuit

Next, the circuit configuration of the output switching circuit 30 will be described. As illustrated in FIG. 6, the output switching circuit 30 includes a plurality of (four in the illustrated example) input terminals 131 to 134, a plurality of (four in the illustrated example) switches S51 to S54, an output terminal 130, and a control terminal 135.

The output terminal 130 is connected to the filter 4. The output terminal 130 is a terminal for supplying the filter 4 with a voltage selected from among the voltages V11 to V14.

The plurality of input terminals 131 to 134 are connected to the nodes N1 to N4 of the switched-capacitor circuit 20, respectively. The plurality of input terminals 131 to 134 are terminals for receiving the voltages V11 to V14 from the switched-capacitor circuit 20.

The control terminal 135 is an input terminal for a digital control signal. Specifically, the control terminal 135 is a terminal for receiving a digital control signal indicating one of the voltages V11 to V14. The output switching circuit 30 controls ON/OFF of the plurality of switches S51 to S54 so as to select a voltage level indicated by the digital control signal.

The digital control signal received via the control terminal 135 includes, for example, two digital control logic/line (DCL) signals. The two DCL signals are each a 1-bit signal. One of the voltages V11 to V14 is indicated by a combination of the two 1-bit signals. For example, the voltages V11, V12, V13, and V14 are indicated by "00", "01", "10", and "11", respectively. A gray code may be used to express a voltage level. In the above case, two control terminals are provided to receive the two DCL signals. The number of DCL signals may be any number greater than or equal to one in accordance with the number of voltage levels. The DCL signal may be a signal of two or more bits. The digital control signal can be one or more DCL signals or can be a source-synchronous control signal.

The switch S51 is connected between the input terminal 131 and the output terminal 130. Specifically, the switch S51 has a first terminal connected to the input terminal 131 and a second terminal connected to the output terminal 130. In this connection configuration, ON/OFF switching of the switch S51 enables switching between connection and disconnection between the input terminal 131 and the output terminal 130.

The switch S52 is connected between the input terminal 132 and the output terminal 130. Specifically, the switch S52 has a first terminal connected to the input terminal 132 and a second terminal connected to the output terminal 130. In this connection configuration, ON/OFF switching of the switch S52 enables switching between connection and disconnection between the input terminal 132 and the output terminal 130.

The switch S53 is connected between the input terminal 133 and the output terminal 130. Specifically, the switch S53 has a first terminal connected to the input terminal 133 and a second terminal connected to the output terminal 130. In this connection configuration, ON/OFF switching of the switch S53 enables switching between connection and disconnection between the input terminal 133 and the output terminal 130.

The switch S54 is connected between the input terminal 134 and the output terminal 130. Specifically, the switch S54 has a first terminal connected to the input terminal 134 and a second terminal connected to the output terminal 130. In this connection configuration, ON/OFF switching of the switch S54 enables switching between connection and disconnection between the input terminal 134 and the output terminal 130.

The plurality of switches S51 to S54 are controlled so as to be exclusively turned ON. In other words, only any one of the switches S51 to S54 is turned ON, and the others are turned OFF. Accordingly, the output switching circuit 30 is capable of outputting one voltage selected from among voltages V11 to V14.

With the above-described configuration, the output switching circuit 30 receives a digital control signal corresponding to an envelope signal through the control terminal 135, controls ON/OFF of the plurality of switches S51 to S54 in response to the digital control signal received through the control terminal 135, and selects at least one of the plurality of voltages V11 to V14 generated by the switched-capacitor circuit 20. The output switching circuit 30 outputs the selected voltage to the filter 4.

The configuration of the output switching circuit 30 illustrated in FIG. 6 is an example. The configuration of the output switching circuit 30 is not limited to the configuration illustrated in FIG. 6. In particular, the switches S51 to S54 may have any configuration as long as any one of the four input terminals 131 to 134 can be selected and connected to the output terminal 130. For example, the output switching circuit 30 may further include a switch connected between a set of the switches S51 to S53 and a set of the switch S54 and the output terminal 130. For example, the output switching circuit 30 may further include a switch connected between a set of the switches S51 and S52 and a set of the switches S53 and S54 and the output terminal 130.

For example, in the case of selecting one voltage from among multiple voltages of two discrete voltage levels, it is sufficient that the output switching circuit 30 include at least the switches S52 and S53.

The output switching circuit 30 can be configured to output two or more voltages. In this case, it is sufficient that the output switching circuit 30 further includes a necessary number of additional switch sets similar to the set of the switches S51 to S54 and additional output terminals.

The switches included in the output switching circuit 30 are included in the tracker component 3 (see FIG. 3). Specifically, the tracker component 3 includes the plurality of switches S51 to S54.

(5.4) Pre-Regulator Circuit

Next, the circuit configuration of the pre-regulator circuit 10 will be described. As illustrated in FIG. 6, the pre-regulator circuit 10 includes an input terminal 110, a plurality of (four in the illustrated example) output terminals 111 to 114, a plurality of inductor connection terminals 115 and 116, a control terminal 117, a plurality of (five in the illustrated example) switches S61, S62, S63, S71, and S72, a power inductor L71, and a plurality of capacitors C61, C62, C63, and C64.

The input terminal 110 is an input terminal for a DC voltage. Specifically, the input terminal 110 is a terminal for receiving an input voltage from the DC power source 50.

The output terminal 111 is an output terminal for the voltage V14. Specifically, the output terminal 111 is a terminal for supplying the voltage V14 to the switched-capacitor circuit 20. The output terminal 111 is connected to the node N4 of the switched-capacitor circuit 20.

The output terminal 112 is an output terminal for the voltage V13. Specifically, the output terminal 112 is a terminal for supplying the voltage V13 to the switched-capacitor circuit 20. The output terminal 112 is connected to the node N3 of the switched-capacitor circuit 20.

The output terminal 113 is an output terminal for the voltage V12. Specifically, the output terminal 113 is a terminal for supplying the voltage V12 to the switched-capacitor circuit 20. The output terminal 113 is connected to the node N2 of the switched-capacitor circuit 20.

The output terminal 114 is an output terminal for the voltage V11. Specifically, the output terminal 114 is a terminal for supplying the voltage V11 to the switched-capacitor circuit 20. The output terminal 114 is connected to the node N1 of the switched-capacitor circuit 20.

The inductor connection terminal 115 is connected to one end (first end) of the power inductor L71. The inductor connection terminal 116 is connected to the other end (second end) of the power inductor L71.

The control terminal 117 is an input terminal for a digital control signal. Specifically, the control terminal 117 is a terminal for receiving a digital control signal for controlling the pre-regulator circuit 10.

The switch S71 is connected between the input terminal 110 and the one end (first end) of the power inductor L71. Specifically, the switch S71 has a first terminal connected to the input terminal 110, and a second terminal connected to the one end of the power inductor L71 via the inductor connection terminal 115. In this connection configuration, ON/OFF switching of the switch S71 enables switching between connection and disconnection between the input terminal 110 and the one end of the power inductor L71.

The switch S72 is connected between the one end (first end) of the power inductor L71 and ground. Specifically, the switch S72 has a first terminal connected to the one end of the power inductor L71 via the inductor connection terminal 115, and a second terminal connected to ground. In this connection configuration, ON/OFF switching of the switch S72 enables switching between connection and disconnection between the one end of the power inductor L71 and ground.

The switch S61 is connected between the other end (second end) of the power inductor L71 and the output terminal 111. Specifically, the switch S61 has a first terminal connected to the other end of power inductor L71, and a second terminal connected to the output terminal 111. In this connection configuration, ON/OFF switching of the switch S61 enables switching between connection and disconnection between the other end of the power inductor L71 and the output terminal 111.

The switch S62 is connected between the other end (second end) of the power inductor L71 and the output terminal 112. Specifically, the switch S62 has a first terminal connected to the other end of power inductor L71, and a second terminal connected to the output terminal 112. In this connection configuration, ON/OFF switching of the switch S62 enables switching between connection and disconnection between the other end of the power inductor L71 and the output terminal 112.

The switch S63 is connected between the other end (second end) of the power inductor L71 and the output terminal 113. Specifically, the switch S63 has a first terminal connected to the other end of power inductor L71, and a second terminal connected to the output terminal 113. In this connection configuration, ON/OFF switching of the switch S63 enables switching between connection and disconnection between the other end of the power inductor L71 and the output terminal 113.

The capacitor C61 is connected between the output terminal 111 and the output terminal 112. One of the two electrodes (first electrode) of the capacitor C61 is connected to the switch S61 and the output terminal 111, and the other of the two electrodes (second electrode) of the capacitor C61 is connected to the switch S62, the output terminal 112, and one of the two electrodes (first electrode) of the capacitor C62.

The capacitor C62 is connected between the output terminal 112 and the output terminal 113. The one of the two electrodes (first electrode) of the capacitor C62 is connected to the switch S62, the output terminal 112, and the other of the two electrodes (second electrode) of the capacitor C61, and the other of the two electrodes (second electrode) of the capacitor C62 is connected to the switch S63, the output terminal 113, and one of the two electrodes of the capacitor C63.

The capacitor C63 is connected between the output terminal 113 and the output terminal 114. The one of the two electrodes (first electrode) of the capacitor C63 is connected to the switch S63, the output terminal 113, and the other of the two electrodes (second electrode) of the capacitor C62, and the other of the two electrodes (second electrode) of the capacitor C63 is connected to the output terminal 114 and one of the two electrodes (first electrode) of the capacitor C64.

The capacitor C64 is connected between the output terminal 114 and ground. The one of the two electrodes (first electrode) of the capacitor C64 is connected to the output terminal 114 and the other of the two electrodes (second electrode) of the capacitor C63, and the other of the two electrodes (second electrode) of the capacitor C64 is connected to ground.

The plurality of switches S61 to S63 are controlled so as to be exclusively turned ON. In other words, only any one of the switches S61 to S63 is turned ON, and the others are turned OFF. Turning ON of any one of the switches S61 to S63 enables the levels of the voltages V11 to V14 to be changed.

The pre-regulator circuit 10 configured as described above supplies electric charge to the switched-capacitor circuit 20 via at least one of the plurality of output terminals 111 to 113.

The switches included in the pre-regulator circuit 10 are mounted in the tracker component 3 (see FIG. 3). Specifically, the tracker component 3 includes the plurality of switches S61 to S63, S71, and S72.

(5.5) Filter

Next, the circuit configuration of the filter 4 will be described. As illustrated in FIG. 6, the filter 4 includes a plurality of (three in the illustrated example) inductors L51 to L53, a plurality of (two in the illustrated example) capacitors C51 and C52, a resistor R51, an input terminal 140, and an output terminal 141.

The input terminal 140 is a terminal for receiving a voltage selected by the output switching circuit 30. Specifically, the input terminal 140 is a terminal for receiving a voltage selected from among the plurality of voltages V11 to V14.

The output terminal 141 is a terminal for outputting the power supply voltage V1. Specifically, the output terminal 141 is a terminal for supplying the power supply voltage V1 to the first PA 81.

The inductors L51 and L52 are connected in series to each other between the input terminal 140 and the output terminal 141. A series connection circuit of the inductor L53 and the resistor R51 is connected in parallel to the inductor L51. The capacitor C51 is connected between ground and a node between the inductors L51 and L52. The capacitor C52 is connected between the output terminal 141 and ground.

With the above-described configuration, the filter 4 serves as an LC low pass filter in which the inductors L51 to L53 are disposed on series-arm paths and the capacitors C51 and C52 are disposed on parallel-arm paths. Accordingly, the filter 4 is capable of reducing a radio frequency component included in a power supply voltage. For example, when a predetermined band is a frequency band for frequency division duplex (FDD), the filter 4 is configured to reduce a component of a downlink operation band of the predetermined band.

The configuration of the filter 4 illustrated in FIG. 6 is an example, and the configuration of the filter 4 is not limited to the configuration illustrated in FIG. 6. The filter 4 may serve as a band pass filter or a high pass filter depending on a band to be removed.

The filter 4 may include two or more LC filters. The two or more LC filters may be connected in common to the output terminal 130, and each LC filter may have a pass band or an attenuation band corresponding to one of different bands. Alternatively, a first filter group formed by two or more LC filters may be connected to a first output terminal of the output switching circuit 30, a second filter group formed by two or more other LC filters may be connected to a second output terminal of the output switching circuit 30, and each LC filter may have a pass band or an attenuation band corresponding to one of different bands. In this case, the filter 4 may have two or more output terminals, and may simultaneously output two or more power supply voltages V1 to first PAs 81 different from each other.

(6) Operation of Tracker Module

Next, the operation of the tracker module 1 according to the first embodiment will be described with reference to FIG. 3. It is assumed that the first PA 81 to which the power supply voltage V1 is applied from the tracker component 3 supports a first communication band, and the second PA 82 to which the power supply voltage V2 is applied from the tracker component 3 supports a second communication band.

The tracker component 3 outputs the power supply voltage V1. The filter 4 passes the power supply voltage V1 from the tracker component 3. Because the power supply voltage V1 is not a sinusoidal voltage, the filter 4 reduces a harmonic component of the power supply voltage V1. Specifically, the filter 4 cuts a harmonic component of the power supply voltage V1 and passes a fundamental wave component of the power supply voltage V1. The tracker module 1 then outputs, from the first output terminal 6, the power supply voltage V1 passed through the filter 4. The power supply voltage V1 that has passed through the filter 4 is applied to the first PA 81. In this way, the power supply voltage V1 with a reduced harmonic component is output from the first output terminal 6 of the tracker module 1.

The tracker component 3 outputs the power supply voltage V2. The tracker module 1 outputs the power supply voltage V2 from the second output terminal 7, without allowing the power supply voltage V2 to pass through the filter 4. The power supply voltage V2 is applied to the second PA 82. Because the power supply voltage V2 has not passed through the filter 4, the power supply voltage V2 that is relatively high is output from the second output terminal 7 of the tracker module 1.

The power class of the second PA 82 connected to the second output terminal 7 is higher than the power class of the first PA 81 connected to the first output terminal 6. For example, the first PA 81 is a PA of a non-high power class, whereas the second PA 82 is a PA of a high power class.

For purposes of this disclosure, "power class" refers to classification of output power of a terminal defined by a maximum output power or the like. As the value thereof decreases, the power of the output increases. For example, the output power of power class 2 is higher than the output power of power class 3. The maximum output power of the high power class is greater than the maximum output power of the non-high power class. The maximum output power is measured by, for example, a method defined by 3GPP (3rd Generation Partnership Project) or the like.

As described above, the power supply voltage V2 to be output from the second output terminal 7 does not pass through the filter 4, and thus the power supply voltage V2 can be output to the second PA 82 without being affected by losses due to the filter 4. This configuration enables a large power-supply power to be output to the second PA 82 of a high power class.

The first PA 81 connected to the first output terminal 6 is a PA that amplifies an FDD transmit signal, and the second PA 82 connected to the second output terminal 7 is a PA that amplifies a TDD transmit signal.

In FDD communication, a reception operation is performed together with a transmission operation. The power supply voltage V1 is not sinusoidal, and thus includes a harmonic component. The harmonic component of the power supply voltage V1 may become a noise component in a reception operation. For example, mixing of the harmonic component of the power supply voltage V1 and a transmit signal may produce a noise component of the frequencies of the communication band Of a receive signal.

In the first embodiment, the power supply voltage V1 is output from the tracker component 3, passes through the filter 4, and is input to the first PA 81. Accordingly, the noise component of the power supply voltage V1 can be reduced at the time of FDD communication.

On the other hand, TDD communication requires a higher power supply voltage than FDD communication. The power supply voltage V2 for the second PA 82 needs to be higher than the power supply voltage V1 for the first PA 81. The power supply voltage V2 is output to the second PA 82 without passing through the filter 4. There is no attenuation in the filter 4, and thus the power supply voltage V2 having a desired voltage value can be applied without loss at the time of TDD communication.

(7) Advantageous Effects

In the tracker module 1 according to the first embodiment, the first output terminal 6 is connected to the tracker component 3 via the filter 4 and overlaps the rectangular region A1 encompassing the inductor 41 and the capacitor 42 of the filter 4. This configuration reduces the noise component of the power supply voltage V1 output from the first output terminal 6 and reduces the wiring length between the filter 4 and the first output terminal 6.

In the tracker module 1 according to the first embodiment, the first output terminal 6 overlaps at least one of the inductor 41 and the capacitor 42. This configuration further reduces the wiring length between the filter 4 and the first output terminal 6.

In the tracker module 1 according to the first embodiment, the second output terminal 7 overlaps the tracker component 3. This configuration reduces the wiring length between the tracker component 3 and the second output terminal 7.

In the tracker module 1 according to the first embodiment, the power class of the second PA 82 connected to the second output terminal 7 is higher than the power class of the first PA 81 connected to the first output terminal 6. This configuration enables a large power-supply power to be output to the second PA 82 of a high power class.

In the tracker module 1 according to the first embodiment, the first PA 81 connected to the first output terminal 6 is a PA that amplifies an FDD transmit signal, and the second PA 82 connected to the second output terminal 7 is a PA that amplifies a TDD transmit signal. Accordingly, the noise component of the power supply voltage V1 can be reduced in FDD.

In the tracker module 1 according to the first embodiment, the first output terminal 6 is disposed at an outermost periphery of the second main surface 22 of the substrate 2. Accordingly, the first output terminal 6 is easily connected to the first PA 81.

In the tracker module 1 according to the first embodiment, the first output terminal 6 overlaps, of the inductor 41 and the capacitor 42, an element closest to the first output terminal 6. This configuration further reduces the wiring length between the filter 4 and the first output terminal 6.

(8) Modifications

Hereinafter, modifications of the first embodiment will be described.

In a first modification of the first embodiment, the first output terminal 6 may overlap an element other than the inductor 41 included in the filter 4 in plan view in the thickness direction of the substrate 2. In an exemplary aspect, the first output terminal 6 overlaps the capacitor 42 included in the filter 4 or overlaps both the inductor 41 and the capacitor 42. In short, it is sufficient that the first output terminal 6 overlap at least one of the inductor 41 and the capacitor 42 included in the filter 4 in plan view in the thickness direction of the substrate 2.

In a second modification of the first embodiment, the first output terminal 6 need not necessarily be disposed at an outermost periphery of the second main surface 22 of the substrate 2. In other words, the first output terminal 6 may be disposed such that another external connection terminal 5 is present between the first output terminal 6 and the outer edge of the substrate 2.

In a third modification of the first embodiment, the filter 4 may be an LC filter other than an L-shaped filter. For example, the filter 4 may be a n-shaped filter or a T-shaped filter.

When the filter 4 is a n-shaped filter, an inductor is provided on a path between the tracker component 3 and the first output terminal 6, one end of a first capacitor is connected to a path between the inductor and the tracker component 3, one end of a second capacitor is connected to a path between the inductor and the first output terminal 6, and thereby the filter 4 is formed.

When the filter 4 is a n-shaped filter, an element closest to the first output terminal 6 includes the inductor and the second capacitor. Thus, it is preferable that the first output terminal 6 overlap at least one of the inductor and the second capacitor in plan view in the thickness direction of the substrate 2. Accordingly, the wiring length between the first output terminal 6 and the filter 4 can be further reduced as compared with a case where the first output terminal 6 overlaps neither the inductor nor the second capacitor.

When the filter 4 is a T-shaped filter, a first inductor and a second inductor are provided so as to be connected in series to a path between the tracker component 3 and the first output terminal 6, one end of a capacitor is connected to a path between the first inductor and the second inductor, and thereby the filter 4 is formed. To the path between the first inductor and the second inductor, one end of a series circuit of the capacitor and a third inductor may be connected.

When the filter 4 is a T-shaped filter, an element closest to the first output terminal 6 is the second inductor. Thus, it is preferable that the first output terminal 6 overlap the second inductor in plan view in the thickness direction of the substrate 2. Accordingly, the wiring length between the first output terminal 6 and the filter 4 can be further reduced as compared with a case where the first output terminal 6 does not overlap the second inductor.

In a fourth modification of the first embodiment, the second output terminal 7 need not necessarily overlap the tracker component 3 (region A2) in plan view in the thickness direction of the substrate 2. That is, the second output terminal 7 may be disposed at a position different from the region A2 on the second main surface 22 of the substrate 2.

In a fifth modification of the first embodiment, the filter 4 is not limited to a low pass filter and can be any filter configured to cut a harmonic component of the power supply voltage V1.

The tracker module according to each of the above-described modifications also achieves effects similar to those of the tracker module 1 according to the first embodiment.

Second Embodiment

Figure 9:
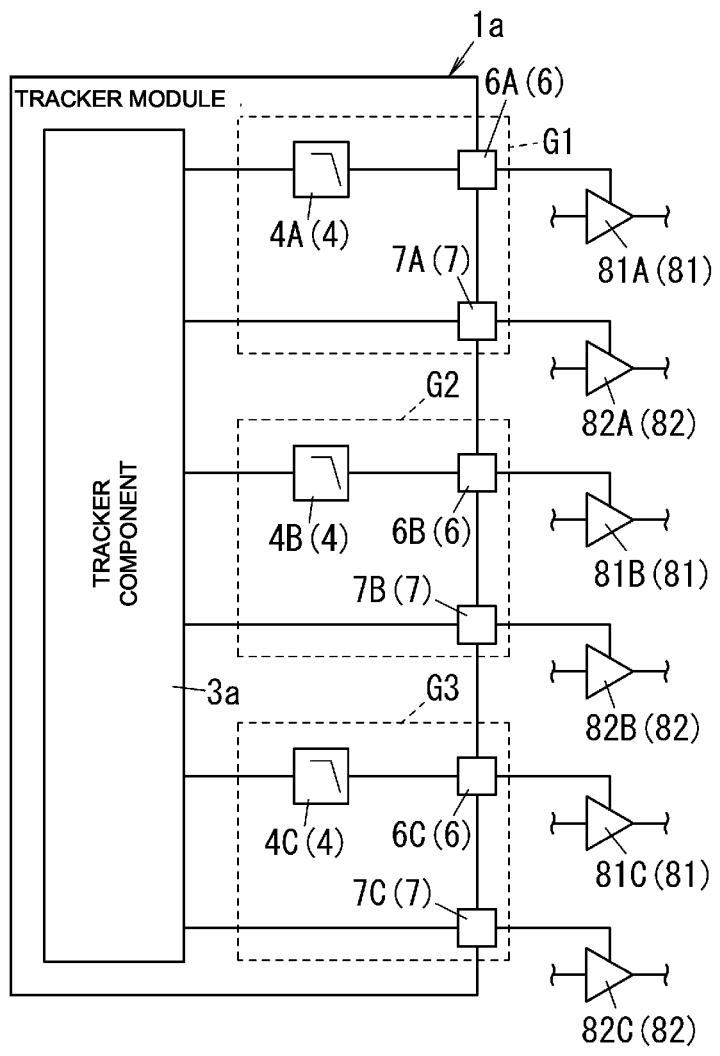
FIG. 9 is a block diagram illustrating the configuration of the tracker module according to the second exemplary embodiment.

A tracker module 1a according to a second embodiment is different from the tracker module 1 according to the first embodiment (see FIG. 3) in that the tracker module 1a includes a plurality of groups G1 to G3 each including a filter 4, a first output terminal 6, and a second output terminal 7, as illustrated in FIG. 9. Regarding the tracker module 1a according to the second embodiment, the constituent elements similar to those of the tracker module 1 according to the first embodiment are denoted by the same reference numerals, and the description thereof will be omitted.

Configuration

Figure 7:
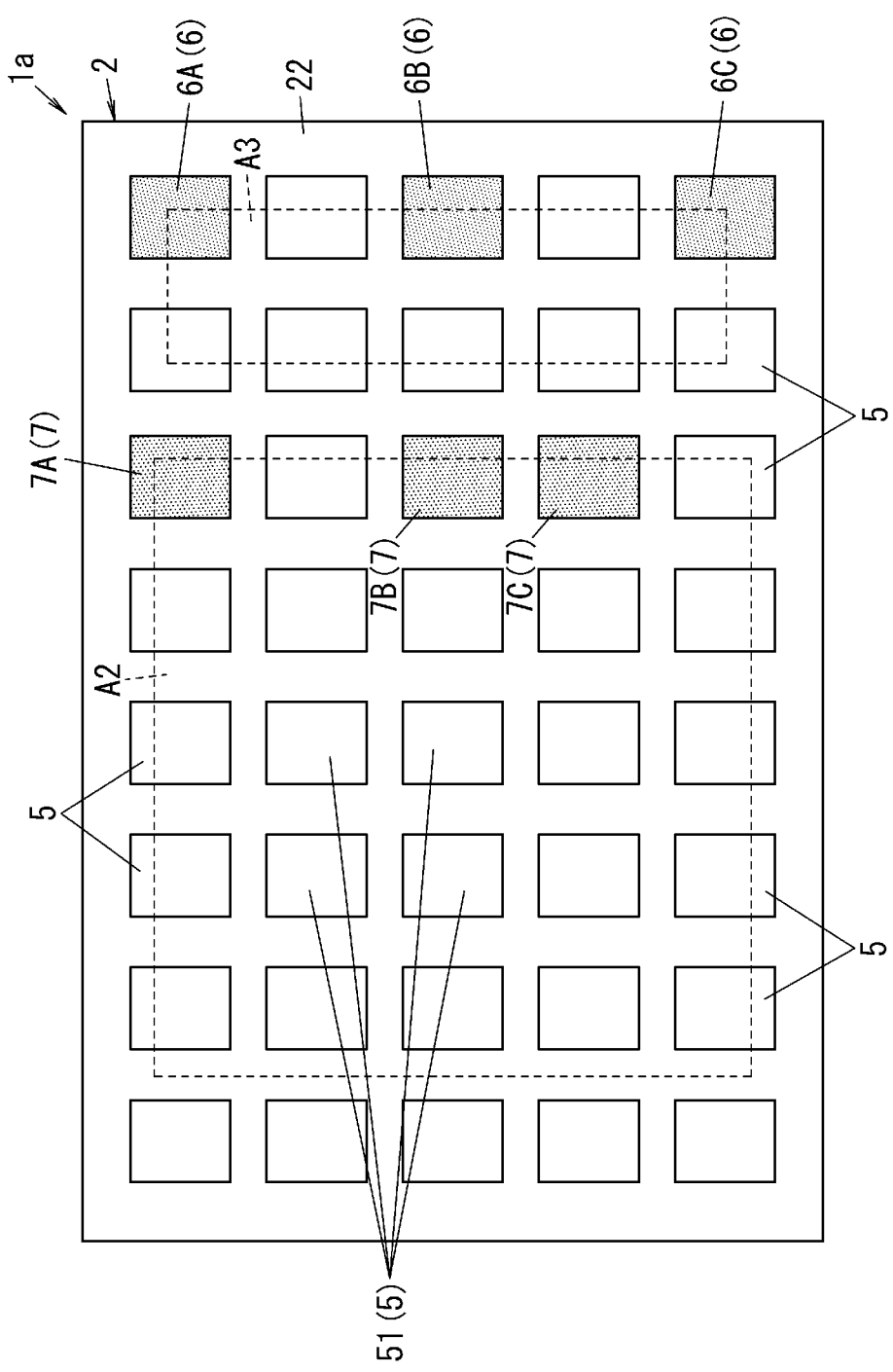
FIG. 7 is a perspective view of a tracker module according to a second exemplary embodiment.
Figure 8:
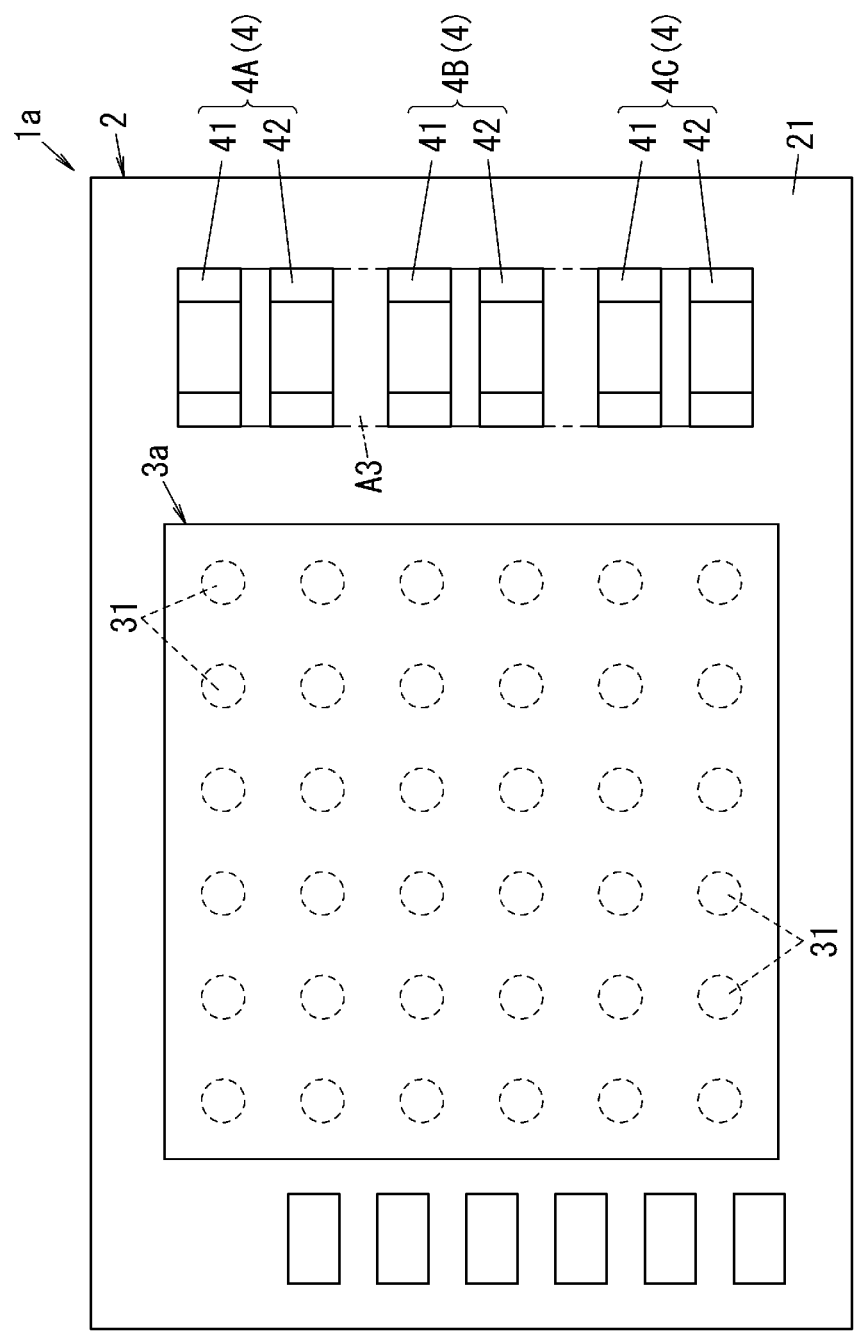
FIG. 8 is a plan view of the tracker module according to the second exemplary embodiment.

As illustrated in FIG. 7 and FIG. 8, the tracker module 1a according to the second embodiment includes a substrate 2, a tracker component 3a, a plurality of filters 4, and a plurality of external connection terminals 5.

Tracker Component

Like the tracker component 3 of the first embodiment, the tracker component 3a is disposed on the first main surface 21 of the substrate 2, and generates power supply voltages V1 and V2, as illustrated in FIG. 8 and FIG. 9. Like the tracker component 3 of the first embodiment, the tracker component 3a includes a plurality of terminals 31.

The tracker component 3a is configured to output power supply voltages V1 to a plurality of (three in the illustrated example) first PAs 81. For example, the tracker component 3a is capable of outputting power supply voltages V1 individually to the plurality of first PAs 81. The tracker component 3a is configured to output power supply voltages V2 to a plurality of (three in the illustrated example) second PAs 82. For example, the tracker component 3a is capable of outputting power supply voltages V2 individually to the plurality of second PAs 82.

Groups

As illustrated in FIG. 9, the tracker module 1a according to the second embodiment includes the plurality of groups G1 to G3. Each of the plurality of groups G1 to G3 includes a filter 4, a first output terminal 6 connected to a first PA 81, and a second output terminal 7 connected to a second PA 82. More specifically, the group G1 includes a filter 4A, a first output terminal 6A connected to a first PA 81A, and a second output terminal 7A connected to a second PA 82A. The group G2 includes a filter 4B, a first output terminal 6B connected to a first PA 81B, and a second output terminal 7B connected to a second PA 82B. The group G3 includes a filter 4C, a first output terminal 6C connected to a first PA 81C, and a second output terminal 7C connected to a second PA 82C.

Filters

As illustrated in FIG. 8, the plurality of filters 4 are disposed on the first main surface 21 of the substrate 2 and are connected to the tracker component 3a. As illustrated in FIG. 9, each filter 4 is connected to the tracker component 3a and the corresponding first output terminal 6. Each filter 4 reduces a harmonic component of the power supply voltage V1 that is to be output from the first output terminal 6 belonging to the same group G1, G2, or G3.

Like the filter 4 of the first embodiment, each filter 4 is an LC filter including an inductor 41 and a capacitor 42 as main constituent elements, as illustrated in FIG. 8. Each filter 4 is, for example, a low pass filter. In the example in FIG. 8, each filter 4 includes an inductor 41 and a capacitor 42. The inductor 41 is a chip inductor, and the capacitor 42 is a chip capacitor. Like the filter 4 of the first embodiment, each filter 4 is an L-shaped filter, for example.

First Output Terminals and Second Output Terminals

As illustrated in FIG. 7, the plurality of (three in the illustrated example) first output terminals 6 belonging to the plurality of groups G1 to G3 overlap a rectangular region A3 of the plurality of filters 4 in plan view in the thickness direction of the substrate 2. The rectangular region A3 is a region encompassing the plurality of filters 4.

According to the exemplary aspect, the rectangular region A3 is a region surrounded by four sides. The left side of the rectangular region A3 is a line including a leftmost edge of the inductors 41 and the capacitors 42 of the plurality of filters 4 in plan view in the thickness direction of the substrate 2. The lower side of the rectangular region A3 is a line including a lowermost edge of the inductors 41 and the capacitors 42 of the plurality of filters 4 in plan view in the thickness direction of the substrate 2. The right side of the rectangular region A3 is a line including a rightmost edge of the inductors 41 and the capacitors 42 of the plurality of filters 4 in plan view in the thickness direction of the substrate 2. The upper side of the rectangular region A3 is a line including an uppermost edge of the inductors 41 and the capacitors 42 of the plurality of filters 4 in plan view in the thickness direction of the substrate 2. The above-described edges may be points or sides.

In the example in FIG. 7, the left side of the rectangular region A3 is located on the left edges of the inductors 41 and the capacitors 42 of the filters 4A to 4C. The lower side of the rectangular region A3 is located on the lower edge of the capacitor 42 of the filter 4C. The right side of the rectangular region A3 is located on the right edges of the inductors 41 and the capacitors 42 of the filters 4A to 4C. The upper side of the rectangular region A3 is located on the upper edge of the inductor 41 of the filter 4A.

This configuration, in the rectangular region A3, connects the first output terminal 6 connected to the first PA 81 to the filter 4 in each of the plurality of groups G1 to G3. As a result, the wiring length between the first output terminal 6 connected to the first PA 81 and the filter 4 can be reduced. More specifically, the wiring length can be reduced between the first output terminal 6A connected to the first PA 81A and the filter 4A, the wiring length between the first output terminal 6B connected to the first PA 81B and the filter 4B, and the wiring length between the first output terminal 6C connected to the first PA 81C and the filter 4C.

As illustrated in FIG. 7, the first output terminals 6 belonging to the groups G1 to G3 different from each other are arranged on the second main surface 22 of the substrate 2 so as not to be adjacent to each other. More specifically, on the second main surface 22 of the substrate 2, the first output terminal 6A belonging to the group G1, the first output terminal 6B belonging to the group G2, and the first output terminal 6C belonging to the group G3 are arranged so as not to be adjacent to each other. The external connection terminals 5 between the first output terminals 6 are preferably ground terminals connected to ground.

Accordingly, the first output terminals 6 belonging to the groups G1 to G3 different from each other can be apart from each other, and thus the isolation between the first output terminals 6 belonging to the groups G1 to G3 different from each other can be improved as compared with a case where the first output terminals 6 belonging to the groups G1 to G3 different from each other are adjacent to each other.

As illustrated in FIG. 7, the second output terminals 7 belonging to the groups G1 to G3 different from each other are arranged on the second main surface 22 of the substrate 2. More specifically, on the second main surface 22 of the substrate 2, the second output terminal 7A belonging to the group G1 and the second output terminal 7B belonging to the group G2 are arranged so as not to be adjacent to each other. On the other hand, the second output terminal 7B belonging to the group G2 and the second output terminal 7C belonging to the group G3 are arranged adjacent to each other.

Accordingly, the second output terminals 7 belonging to the groups G1 to G3 different from each other can be apart from each other as necessary, and thus the isolation between the second output terminals 7 belonging to the groups G1 to G3 different from each other can be improved as necessary.

For purposes of this disclosure, the phrase "the output terminals (the first output terminals 6 or the second output terminals 7) belonging to the groups G1 to G3 different from each other are arranged so as not to be adjacent to each other" means that the output terminals are arranged such that at least one of the other external connection terminals 5 is present between the output terminals. Moreover, the term "output terminal" is the first output terminal 6 or the second output terminal 7.

In the example in FIG. 7, one external connection terminal 5 is present between the first output terminal 6A and the first output terminal 6B, and thus the first output terminal 6A and the first output terminal 6B are arranged so as not to be adjacent to each other. Similarly, one external connection terminal 5 is present between the first output terminal 6B and the first output terminal 6C, and thus the first output terminal 6B and the first output terminal 6C are arranged so as not to be adjacent to each other. Furthermore, one external connection terminal 5 is present between the second output terminal 7A and the second output terminal 7B, and thus the second output terminal 7A and the second output terminal 7B are arranged so as not to be adjacent to each other.

In the tracker module 1*a* according to the second embodiment, the second output terminal 7 in each of the plurality of groups G1 to G3 overlaps a region A2 in plan view in the thickness direction of the substrate 2, as illustrated in FIG. 7. That is, the second output terminals 7 overlap the tracker component 3*a* (see FIG. 8) in plan view in the thickness direction of the substrate 2.

This configuration connects, in the region A2, an output terminal (not illustrated) of the tracker component 3*a* and the second output terminal 7 to each other in each of the plurality of groups G1 to G3. As a result, the wiring lengths between the tracker component 3*a* and the second output terminals 7 connected to the second PAs 82 can be reduced as compared with a case where the second output terminals connected to the second PAs do not overlap the region of the tracker component.

(2) Operation

Next, the operation of the tracker module 1*a* according to the second embodiment will be described with reference to FIG. 9. It is assumed that, in each of the groups G1 to G3, the first PA 81 to which the power supply voltage V1 is applied from the tracker component 3*a* supports a first communication band, and the second PA 82 to which the power supply voltage V2 is applied from the tracker component 3*a* supports a second communication band.

According to the exemplary aspect, the first PA 81A for the group G1 is a PA that amplifies an FDD transmit signal, and is, for example, a PA that amplifies a transmit signal whose communication band is the low band. The second PA 82A for the group G1 is a PA that amplifies a TDD transmit signal, and is, for example, a PA that amplifies a transmit signal whose communication band is the ultra-high band. The first PA 81B for the group G2 is a PA that amplifies an FDD transmit signal, and is, for example, a PA that amplifies a transmit signal whose communication band is the mid band. The second PA 82B for the group G2 is a PA that amplifies a TDD transmit signal, and is, for example, a PA that amplifies a transmit signal whose communication band is the high band.

In each of the plurality of groups G1 to G3, the tracker component 3*a* outputs the power supply voltage V1. The filter 4 passes the power supply voltage V1 from the tracker component 3*a*. Because the power supply voltage V1 is not a sinusoidal voltage, the filter 4 reduces a harmonic component of the power supply voltage V1. Specifically, the filter 4 cuts a harmonic component of the power supply voltage V1 and passes a fundamental wave component of the power supply voltage V1. Thereafter, the power supply voltage V1 that has passed through the filter 4 is applied to the first PA 81.

(3) Advantageous Effects

In the tracker module 1*a* according to the second embodiment, the first output terminals 6 belonging to the groups G1 to G3 different from each other are arranged on the second main surface 22 of the substrate 2 so as not to be adjacent to each other. This configuration improves the isolation between the first output terminals 6 in the groups G1 to G3 different from each other.

Third Embodiment

Figure 10:
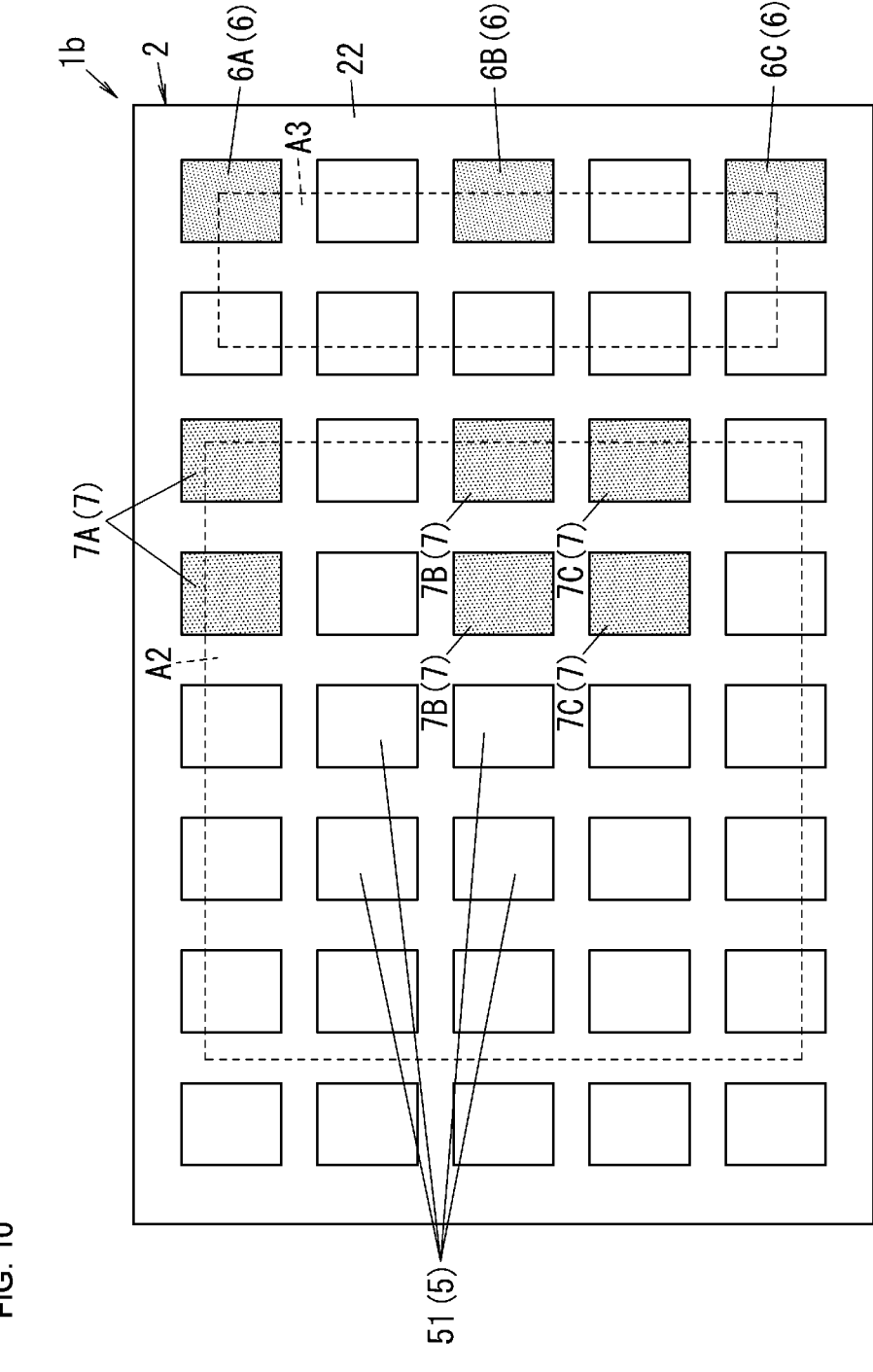
FIG. 10 is a perspective view of a tracker module according to a third exemplary embodiment.

A tracker module 1*b* according to a third embodiment is different from the tracker module 1*a* according to the second embodiment (see FIG. 7) in that the tracker module 1*b* includes a plurality of second output terminals 7 as illustrated in FIG. 10. Regarding the tracker module 1*b* according to the third embodiment, the constituent elements similar to those of the tracker module 1*a* according to the second embodiment are denoted by the same reference numerals, and the description thereof will be omitted.
Configuration As illustrated in FIG. 10, the tracker module 1*b* according to the third embodiment includes a substrate 2, a tracker component 3*a* (see FIG. 8), a plurality of filters 4 (see FIG. 7), and a plurality of external connection terminals 5, like the tracker module 1*a* according to the second embodiment. As illustrated in FIG. 10, the plurality of external connection terminals 5 include a plurality of (two in the illustrated example) second output terminals 7 in each of groups G1 to G3 (see FIG. 9).

In the tracker module 1*b* according to the third embodiment, all the plurality of second output terminals 7 in each of the plurality of groups G1 to G3 overlap a region A2 in plan view in the thickness direction of the substrate 2, as illustrated in FIG. 10. That is, all the plurality of second output terminals 7 overlap the tracker component 3*a* (see FIG. 8) in plan view in the thickness direction of the substrate 2.

This configuration connects, in the region A2, an output terminal (not illustrated) of the tracker component 3*a* and all the plurality of second output terminals 7 to each other in each of the plurality of groups G1 to G3. As a result, the wiring lengths between the tracker component 3*a* and the plurality of second output terminals 7 connected to the second PA 82 can be further reduced.

In the third embodiment, the plurality of second output terminals 7 are larger in number than the first output terminal 6. In the example in FIG. 10, each of the groups G1 to G3 includes two second output terminals 7 and one first output terminal 6.

This configuration outputs large power-supply power to the second PA 82 via the second output terminals 7.

In the third embodiment, the plurality of second output terminals 7 have a maximum load current flowing therethrough, the maximum load current being larger than a maximum load current flowing through the first output terminal 6.

This configuration outputs large power-supply power to the second PA 82 via the second output terminals 7.

(2) Advantageous Effects

In the tracker module 1*b* according to the third embodiment, all the plurality of second output terminals 7 overlap the tracker component 3*a*. This configuration further reduces the wiring lengths between the tracker component 3*a* and the plurality of second output terminals 7.

In the tracker module 1*b* according to the third embodiment, the second output terminals 7 are larger in number than the first output terminal 6. This configuration enable large power-supply power to be output to the second PA 82 via the second output terminals 7.

In the tracker module 1*b* according to the third embodiment, the second output terminals 7 have a maximum load current flowing therethrough, the maximum load current being larger than a maximum load current flowing through the first output terminal 6. This configuration enables large power-supply power to be output to the second PA 82 via the second output terminals 7.

(3) Modifications

In a first modification of the third embodiment, all the plurality of second output terminals 7 need not necessarily overlap the tracker component 3*a* in plan view in the thickness direction of the substrate 2, and only one or some of the plurality of second output terminals 7 may overlap the tracker component 3*a*. When there are two second output terminals 7, one of the two second output terminals 7 may overlap the tracker component 3*a* (region A2), and the other (the remainder) of the two second output terminals 7 need not overlap the tracker component 3*a* (region A2). In short, it is sufficient that at least one of the plurality of second output terminals 7 overlap the tracker component 3*a*.

In a second modification of the third embodiment, at least one of the plurality of second output terminals 7 may overlap the tracker component 3*a* in plan view in the thickness direction of the substrate 2 in one or two of the plurality of groups G1 to G3. The present invention is not limited to the third embodiment in which at least one of the plurality of second output terminals 7 overlaps the tracker component 3*a* in all the plurality of groups G1 to G3. For example, at least one of the plurality of second output terminals 7 may overlap the tracker component 3*a* in the group G1, and at least one of the plurality of second output terminals 7 need not overlap the tracker component 3*a* in the groups G2 and G3. In short, it is sufficient that at least one of the plurality of second output terminals 7 overlap the tracker component 3*a* in at least one of the plurality of groups G1 to G3.

The tracker module according to each of the above-described modifications also achieves effects similar to those of the tracker module 1*b* according to the third embodiment.

Fourth Embodiment

Figure 11:
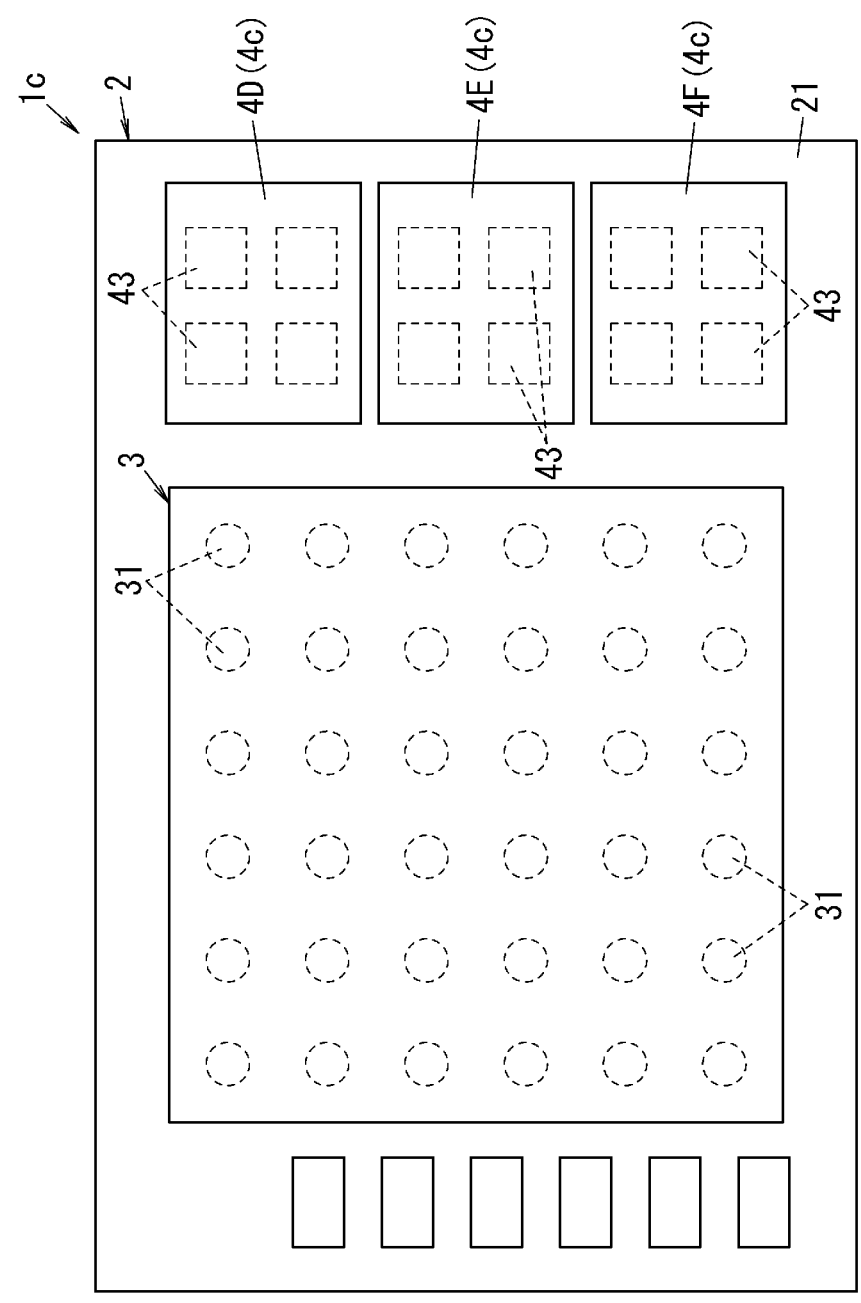
FIG. 11 is a plan view of a tracker module according to a fourth exemplary embodiment.

A tracker module 1*c* according to a fourth embodiment is different from the tracker module 1*a* according to the second embodiment (see FIG. 8) in that the tracker module 1*c* includes a plurality of filters 4*c* each of which is one package, as illustrated in FIG. 11. Regarding the tracker module 1*c* according to the fourth embodiment, the constituent elements similar to those of the tracker module 1*a* according to the second embodiment are denoted by the same reference numerals, and the description thereof will be omitted.

(1) Configuration

As illustrated in FIG. 11, the tracker module 1*c* according to the fourth embodiment includes the plurality of filters 4*c* instead of the plurality of filters 4 of the second embodiment. Like the tracker module 1*a* according to the second embodiment, the tracker module 1*c* includes a substrate 2, a tracker component 3, and a plurality of external connection terminals 5.

Each of the plurality of filters 4*c* is an element including an inductor and a capacitor that are integrated into one package to form the filter 4*c*. Each filter 4*c* is, for example, a low pass filter. A filter 4D belongs to a group G1, a filter 4E belongs to a group G2, and a filter 4F belongs to a group G3.

Figure 12:
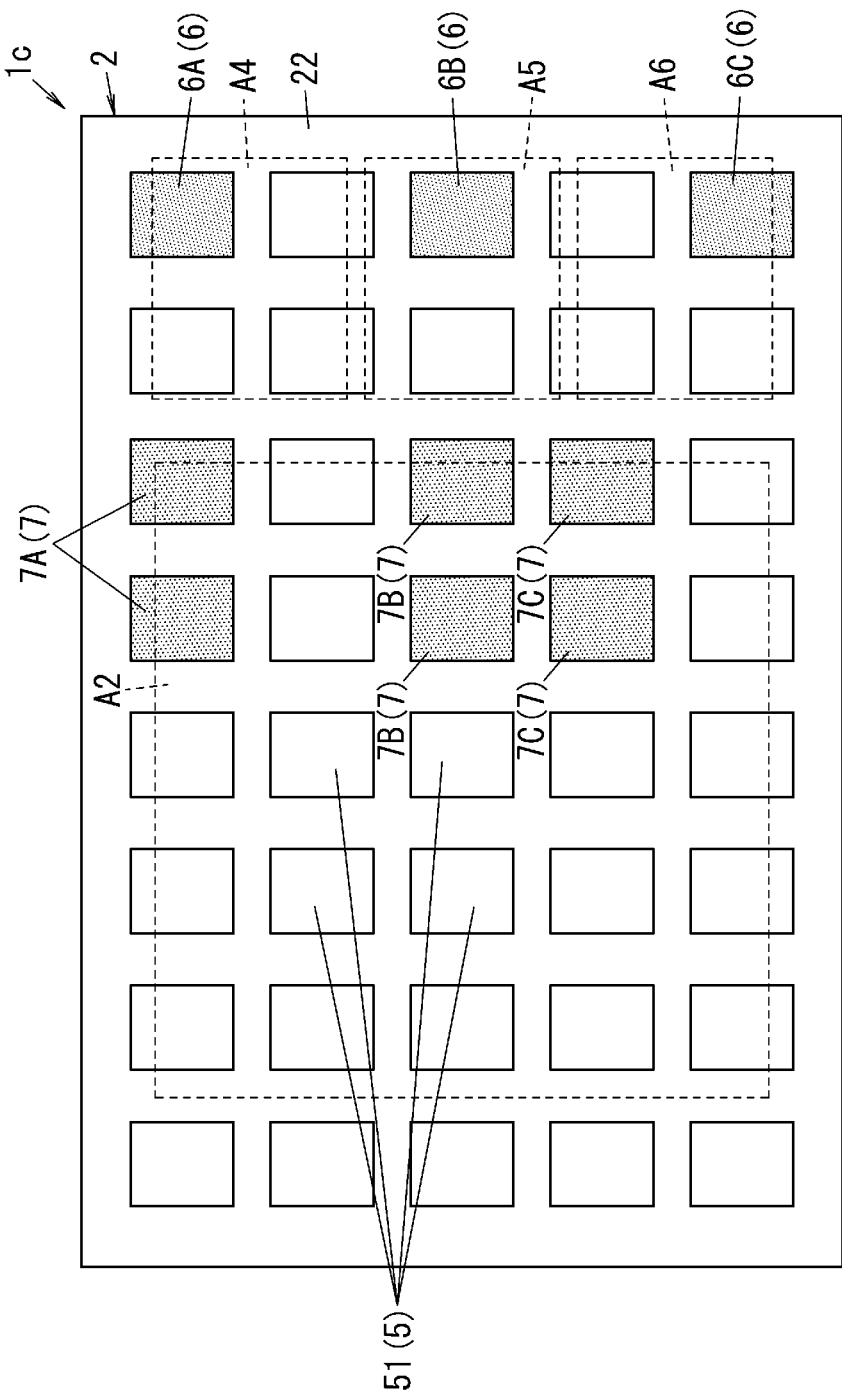
FIG. 12 is a perspective view of the tracker module according to the fourth exemplary embodiment.

As illustrated in FIG. 12, in each of the plurality of groups G1 to G3, the first output terminal 6 overlaps a rectangular region A4 (or A5 or A6) of the filter 4*c* in plan view in the thickness direction of the substrate 2. More specifically, a first output terminal 6A in the group G1 overlaps the rectangular region A4 of the filter 4D, a first output terminal 6B in the group G2 overlaps the rectangular region A5 of the filter 4E, and a first output terminal 6C in the group G3 overlaps the rectangular region A6 of the filter 4F.

(2) Advantageous Effects

In the tracker module 1*c* according to the fourth embodiment, it is possible to connect, in the rectangular region A4 (or A5 or A6)1, an output terminal (not illustrated) of the filter 4*c* and the first output terminal 6 to each other in each of the plurality of groups G1 to G3. As a result, the wiring length between the first output terminal 6 connected to the first PA 81 and the filter 4*c* can be reduced as compared with a case where the first output terminal connected to the first PA does not overlap the rectangular region of the filter.

In the tracker module 1*c* according to the fourth embodiment, each filter 4*c* is an element including an inductor and a capacitor that are integrated into one package. This configuration reduces the arrangement area of each filter 4*c*.

(3) Modifications

In a first modification of the fourth embodiment, in the tracker module 1*c*, the packaged filter 4*c* is not necessarily used in all the plurality of groups G1 to G3, and the filter 4*c* may be used in at least one of the plurality of groups G1 to G3. More specifically, the filter 4*c* may be used in at least one of the plurality of groups G1 to G3, and the filter 4 of the first embodiment may be used in the others of the plurality of groups G1 to G3.

In a second modification of the fourth embodiment, the filter 4*c* is not limited to a low pass filter and can be any filter that cuts a harmonic component of the power supply voltage V1.

The tracker module according to each of the above-described modifications also achieves effects similar to those of the tracker module 1*c* according to the fourth embodiment.

Modifications

In a first modification of the first to fourth embodiments, the tracker module 1, the first PA 81, and the second PA 82 may be formed as a single PA module. That is, the PA module includes the tracker module 1, the first PA 81, and the second PA 82. The PA module may include the tracker module 1*a* according to the second embodiment, the tracker module 1*b* according to the third embodiment, or the tracker module 1*c* according to the fourth embodiment, instead of the tracker module 1 according to the first embodiment.

In the PA module according to the first modification, in the tracker module 1, the first output terminal 6 is connected to the tracker component 3 via the filter 4 and overlaps the rectangular region A1 encompassing the inductor and capacitor of the filter 4. This configuration reduces the noise component of the power supply voltage V1 output from the first output terminal 6 and reduces the wiring length between the filter 4 and the first output terminal 6.

In a second modification of the first to fourth embodiments, the tracker module 1, the first PA 81, the second PA 82, the first transmit filter 83, and the second transmit filter 84 can form one module, that is, an RF module. The RF module according to the second modification includes the tracker module 1, the first PA 81, the second PA 82, the first transmit filter 83, and the second transmit filter 84. The RF module may include the tracker module 1*a* according to the second embodiment, the tracker module 1*b* according to the third embodiment, or the tracker module 1*c* according to the fourth embodiment, instead of the tracker module 1 according to the first embodiment.

In the RF module according to the second modification, in the tracker module 1, the first output terminal 6 is connected to the tracker component 3 via the filter 4 and overlaps the rectangular region A1 encompassing the inductor and capacitor of the filter 4. This configuration reduces the noise component of the power supply voltage V1 output from the first output terminal 6 and reduces the wiring length between the filter 4 and the first output terminal 6.

In a third modification of the first to fourth embodiments, the filter 4 may be an integrated passive device (IPD) including an inductor and a capacitor.

The embodiments and modifications described above are merely some of various embodiments and modifications of the present invention. The embodiments and modifications can be variously changed according to design or the like as long as the object of the present invention can be achieved.

In this specification, "elements are disposed on the first main surface 21 of the substrate 2" includes not only a case where the elements are directly mounted on the first main surface 21 of the substrate 2 but also a case where the elements are disposed in, of a space on the first main surface 21 side and a space on the second main surface 22 side separated from each other by the substrate 2, the space on the first main surface 21 side. That is, "elements are disposed on the first main surface 21 of the substrate 2" includes a case where the elements are mounted on the first main surface 21 of the substrate 2, with other circuit elements, electrodes, or the like interposed therebetween. The elements are, for example, the tracker component 3 and the filter 4. The elements are not limited to the tracker component 3 and the filter 4.

In this specification, "elements are disposed on the second main surface 22 of the substrate 2" includes not only a case where the elements are directly mounted on the second main surface 22 of the substrate 2 but also a case where the elements are disposed in, out of a space on the first main surface 21 side and a space on the second main surface 22 side separated from each other by the substrate 2, the space on the second main surface 22 side. That is, "elements are disposed on the second main surface 22 of the substrate 2" includes a case where the elements are mounted on the second main surface 22 of the substrate 2, with other circuit elements, electrodes, or the like interposed therebetween. The elements are, for example, the first output terminal 6 and the second output terminal 7. The elements are not limited to the first output terminal 6 and the second output terminal 7.

In this specification, "a first element overlaps a second element in plan view in the thickness direction of the substrate 2" includes a case where the entirety of the first element overlaps the entirety of the second element in plan view in the thickness direction of the substrate 2, a case where the entirety of the first element overlaps a part of the second element in plan view in the thickness direction of the substrate 2, a case where a part of the first element overlaps the entirety of the second element in plan view in the thickness direction of the substrate 2, and a case where a part of the first element overlaps a part of the second element in plan view in the thickness direction of the substrate 2. In short, "a first element overlaps a second element in plan view in the thickness direction of the substrate 2" means that "at least a part of the first element overlaps at least a part of the second element". The combination of the first element and the second element is, for example, a combination in which the first element is the first output terminal 6 and the second element is the rectangular region A1 of the filter 4, or a combination in which the first element is the second output terminal 7 and the second element is the tracker component 3. The combination of the first element and the second element is not limited to the above-described combinations.

Aspects

The specification discloses the following aspects.

A tracker module (1; 1*a*; 1*b*; 1*c*) according to a first aspect is configured to output power supply voltages (V1, V2) to a first power amplifier (81) and a second power amplifier (82). The tracker module (1; 1*a*; 1*b*; 1*c*) includes a substrate (2), a tracker component (3; 3*a*), a filter (4; 4*c*), a first output terminal (6), and a second output terminal (7). The substrate (2) has a first main surface (21) and a second main surface (22) opposed to each other. The tracker component (3; 3*a*) is disposed on the first main surface (21) of the substrate (2) and is configured to generate the power supply voltages (V1, V2). The filter (4; 4*c*) is disposed on the first main surface (21) of the substrate (2) and is connected to the tracker component (3; 3*a*). The first output terminal (6) is disposed on the second main surface (22) of the substrate (2) and is connected to the first power amplifier (81). The second output terminal (7) is disposed on the second main surface (22) of the substrate (2) and is connected to the second power amplifier (82). The first output terminal (6) is connected to the tracker component (3; 3*a*) via the filter (4; 4*c*). The second output terminal (7) is connected to the tracker component (3; 3*a*). The filter (4; 4*c*) is an inductor-capacitor (LC) filter including an inductor (41) and a capacitor (42). The first output terminal (6) overlaps a rectangular region (A1; A3; A4; A5; A6) in plan view in a thickness direction of the substrate (2), the rectangular region encompassing the inductor (41) and the capacitor (42) of the filter (4; 4*c*).

In the tracker module (1; 1*a*; 1*b*; 1*c*) according to the first aspect, a noise component of the power supply voltage (V1) to be output to the first power amplifier (81) can be reduced and the wiring length between the first output terminal (6) connected to the first power amplifier (81) and the filter (4; 4*c*) can be reduced.

In a tracker module (1; 1*a*; 1*b*; 1*c*) according to a second aspect, in the first aspect, the first output terminal (6) overlaps at least one of the inductor (41) and the capacitor (42) included in the filter (4; 4*c*) in plan view in the thickness direction of the substrate (2).

In the tracker module (1; 1*a*; 1*b*; 1*c*) according to the second aspect, the wiring length between the first output terminal (6) and the filter (4; 4*c*) can be reduced.

In a tracker module (1; 1*a*; 1*b*; 1*c*) according to a third aspect, in the second aspect, the first output terminal (6) overlaps, of the inductor (41) and the capacitor (42) included in the filter (4; 4c), an element closest to the first output terminal (6) in plan view in the thickness direction of the substrate (2).

In the tracker module (1; 1a; 1b; 1c) according to the third aspect, the wiring length between the first output terminal (6) and the filter (4; 4c) can be reduced.

In a tracker module (1; 1a; 1b; 1c) according to a fourth aspect, in any one of the first to third aspects, the second output terminal (7) includes a plurality of second output terminals (7). At least one of the plurality of second output terminals (7) overlaps the tracker component (3; 3a) in plan view in the thickness direction of the substrate (2).

In the tracker module (1; 1a; 1b; 1c) according to the fourth aspect, the wiring length between the second output terminal (7) connected to the second power amplifier (82) and the tracker component (3; 3a) can be reduced.

In a tracker module (1a; 1b; 1c) according to a fifth aspect, in the fourth aspect, all the plurality of second output terminals (7) overlap the tracker component (3a) in plan view in the thickness direction of the substrate (2).

In the tracker module (1a; 1b; 1c) according to the fifth aspect, the wiring lengths between the plurality of second output terminals (7) and the tracker component (3a) can be reduced.

In a tracker module (1a; 1b; 1c) according to a sixth aspect, in the fourth or fifth aspect, the plurality of second output terminals (7) are larger in number than the first output terminal (6).

In the tracker module (1a; 1b; 1c) according to the sixth aspect, large power-supply power can be output to the second power amplifier (82) via the second output terminals (7).

In a tracker module (1; 1a; 1b; 1c) according to a seventh aspect, in any one of the fourth to sixth aspects, the plurality of second output terminals (7) has a maximum load current flowing therethrough, the maximum load current being larger than a maximum load current flowing through the first output terminal (6).

In the tracker module (1; 1a; 1b; 1c) according to the seventh aspect, large power-supply power van be output to the second power amplifier (82) via the second output terminals (7).

In a tracker module (1; 1a; 1b; 1c) according to an eighth aspect, in any one of the first to seventh aspects, the second power amplifier (82) connected to the second output terminal (7) has a power class higher than a power class of the first power amplifier (81) connected to the first output terminal (6).

In the tracker module (1; 1a; 1b; 1c) according to the eighth aspect, large power-supply power can be output to the second power amplifier (82) of a high power class.

In a tracker module (1; 1a; 1b; 1c) according to a ninth aspect, in any one of the first to eighth aspects, the first power amplifier (81) connected to the first output terminal (6) is a power amplifier configured to amplify a frequency division duplex (FDD) transmit signal. The second power amplifier (82) connected to the second output terminal (7) is a power amplifier configured to amplify a time division duplex (TDD) transmit signal.

In the tracker module (1; 1a; 1b; 1c) according to the ninth aspect, a noise component of the power supply voltage (V1) at the time of FDD can be reduced. As a result, an influence on a receive signal can be reduced, and thus a decrease in reception sensitivity can be suppressed.

In a tracker module (1c) according to a tenth aspect, in any one of the first to ninth aspects, the filter (4c) is an element including the inductor and the capacitor that are integrated into one package.

In the tracker module (1c) according to the tenth aspect, the arrangement area of the filter (4c) can be reduced.

In a tracker module (1; 1a; 1b; 1c) according to an eleventh aspect, in any one of the first to tenth aspects, the first output terminal (6) is disposed at an outermost periphery of the second main surface (22) of the substrate (2).

In the tracker module (1; 1a; 1b; 1c) according to the eleventh aspect, the first output terminal (6) can be easily connected to the first power amplifier (81).

A tracker module (1a; 1b; 1c) according to a twelfth aspect, in any one of the first to eleventh aspects, includes a plurality of groups (G1, G2, G3) each including the filter (4; 4c), the first output terminal (6), and the second output terminal (7). The plurality of first output terminals (6) belonging to the plurality of groups (G1, G2, G3) different from each other are arranged on the second main surface (22) of the substrate (2) so as not to be adjacent to each other.

In the tracker module (1a; 1b; 1c) according to the twelfth aspect, the isolation between the first output terminals (6) in the different groups (G1, G2, G3) can be improved.

A power amplifier module according to a thirteenth aspect includes the tracker module (1; 1a; 1b; 1c) according to any one of the first to twelfth aspects, the first power amplifier (81), and the second power amplifier (82).

In the power amplifier module according to the thirteenth aspect, it is possible to, in the tracker module (1; 1a; 1b; 1c), reduce a noise component of the power supply voltage (V1) to be output to the first power amplifier (81) and reduce the wiring length between the first output terminal (6) connected to the first power amplifier (81) and the filter (4; 4c).

A radio frequency module according to a fourteenth aspect includes the tracker module (1; 1a; 1b; 1c) according to any one of the first to twelfth aspects, the first power amplifier (81), the second power amplifier (82), a first transmit filter (83), and a second transmit filter (84). The first transmit filter (83) is configured to pass a first transmit signal amplified by the first power amplifier (81). The second transmit filter (84) is configured to pass a second transmit signal amplified by the second power amplifier (82).

In the radio frequency module according to the fourteenth aspect, it is possible to, in the tracker module (1; 1a; 1b; 1c), reduce a noise component of the power supply voltage (V1) to be output to the first power amplifier (81) and reduce the wiring length between the first output terminal (6) connected to the first power amplifier (81) and the filter (4; 4c).

A communication device (9) according to a fifteenth aspect includes the tracker module (1; 1a; 1b; 1c) according to any one of the first to twelfth aspects, the first power amplifier (81), the second power amplifier (82), and a signal processing circuit (92). The signal processing circuit (92) is configured to output a first transmit signal to the first power amplifier (81) and output a second transmit signal to the second power amplifier (82).

In the communication device (9) according to the fifteenth aspect, it is possible to, in the tracker module (1; 1a; 1b; 1c), reduce a noise component of the power supply voltage (V1) to be output to the first power amplifier (81) and reduce the wiring length between the first output terminal (6) connected to the first power amplifier (81) and the filter (4; 4c).

REFERENCE SIGNS LIST 1, 1a, 1b, 1c tracker module
2 substrate 21 first main surface
22 second main surface
3, 3a tracker component
31 terminal
4, 4c, 4A, 4B, 4C, 4D, 4E, 4F filter
41 inductor
42 capacitor
5 external connection terminal
51 input terminal
6, 6A, 6B, 6C first output terminal
7, 7A, 7B, 7C second output terminal
8 radio frequency module
81, 81A, 81B, 81C first power amplifier
82, 82A, 82B, 82C second power amplifier
83 first transmit filter
84 second transmit filter
851 first receive filter
852 second receive filter
861 first low-noise amplifier
862 second low-noise amplifier
87 switch
881, 882 signal input terminal
883, 884 signal output terminal
885 antenna terminal
886, 887 terminal
9 communication device
91 antenna
92 signal processing circuit
93 baseband signal processing circuit
94 RF signal processing circuit
V1, V2 power supply voltage
A1, A3, A4, A5, A6 rectangular region
A2 region
G1 to G3 group

What is claimed:

1. A tracker module for outputting power supply voltages to a first power amplifier and a second power amplifier, the tracker module comprising:
    a substrate having a first main surface and a second main surface that oppose each other;
    a tracker component on the first main surface of the substrate and configured to generate the power supply voltages;
    an inductor-capacitor (LC) filter that includes an inductor and a capacitor and that is on the first main surface of the substrate and connected to the tracker component;
    a first output terminal on the second main surface of the substrate and connected to the first power amplifier and also connected to the tracker component via the LC filter; and
    a second output terminal on the second main surface of the substrate and connected to the second power amplifier and further connected to the tracker component,
    wherein the first output terminal overlaps a rectangular region in a plan view in a thickness direction of the substrate, the rectangular region including the inductor and the capacitor of the LC filter.

2. The tracker module according to claim 1, wherein the rectangular region encompasses the inductor and the capacitor of the LC filter.

3. The tracker module according to claim 1, wherein the first output terminal overlaps at least one of the inductor and the capacitor included in the LC filter in the plan view.

4. The tracker module according to claim 3, wherein the first output terminal overlaps either of the inductor and the capacitor included in the LC filter that is closest to the first output terminal in the plan view in the thickness direction of the substrate.

5. The tracker module according to claim 1, wherein:
    the second output terminal comprises a plurality of second output terminals, and
    at least one of the plurality of second output terminals overlaps the tracker component in the plan view in the thickness direction of the substrate.

6. The tracker module according to claim 5, wherein all of the plurality of second output terminals overlap the tracker component in the plan view in the thickness direction of the substrate.

7. The tracker module according to claim 5, wherein the plurality of second output terminals are larger in number than the first output terminal.

8. The tracker module according to claim 5, wherein the plurality of second output terminals have a maximum load current flowing therethrough that is larger than a maximum load current flowing through the first output terminal.

9. The tracker module according to claim 1, wherein the second power amplifier connected to the second output terminal has a power class that is higher than a power class of the first power amplifier connected to the first output terminal.

10. The tracker module according to claim 1, wherein:
    the first power amplifier connected to the first output terminal is a power amplifier configured to amplify a frequency division duplex transmit signal, and
    the second power amplifier connected to the second output terminal is a power amplifier configured to amplify a time division duplex transmit signal.

11. The tracker module according to claim 1, wherein the LC filter includes the inductor and the capacitor that are integrated into a single package.

12. The tracker module according to claim 1, wherein the first output terminal is disposed at an outermost periphery of the second main surface of the substrate.

13. The tracker module according to claim 1, further comprising:
    a plurality of groups each including the LC filter, the first output terminal, and the second output terminal,
    wherein the plurality of first output terminals of the plurality of groups different from each other are arranged on the second main surface of the substrate so as not to be adjacent to each other.

14. The tracker module according to claim 1, wherein the LC filter is disposed adjacent to the tracker component, such that no other elements are interposed between the tracker component and the LC filter.

15. A tracker module comprising:
    a substrate having first and second main surfaces that oppose each other;
    a tracker component on the first main surface of the substrate;
    a filter including an inductor and a capacitor that are disposed on the first main surface of the substrate, the filter being connected to the tracker component;
    a first output terminal on the second main surface of the substrate that connects the first power amplifier to the tracker component via the filter; and
    a second output terminal on the second main surface of the substrate that connects the second power amplifier directly to the tracker component,
    wherein the first output terminal overlaps a region that encompasses the inductor and the capacitor in a plan view in a thickness direction of the substrate.

16. The tracker module according to claim 15, wherein:

the second output terminal comprises a plurality of second output terminals, and at least one of the plurality of second output terminals overlaps the tracker component in the plan view in the thickness direction of the substrate.

17. A power amplifier module comprising:

the tracker module according to claim 1;

the first power amplifier; and the second power amplifier.

18. The power amplifier according to claim 17, wherein the first and second power amplifiers are disposed on a different substrate than the substrate on which the tracker component is disposed.

19. A radio frequency module comprising:

the tracker module according to claim 1;

the first power amplifier;

the second power amplifier;

a first transmit filter configured to pass a first transmit signal amplified by the first power amplifier; and a second transmit filter configured to pass a second transmit signal amplified by the second power amplifier.

20. A communication device comprising:

the tracker module according to claim 1;

the first power amplifier;

the second power amplifier; and a signal processing circuit configured to output a first transmit signal to the first power amplifier and output a second transmit signal to the second power amplifier.

\*   \*   \*   \*   \*